(12) United States Patent
Park et al.

(10) Patent No.: US 12,021,098 B2
(45) Date of Patent: Jun. 25, 2024

(54) IMAGE SENSOR

(71) Applicant: Samsung Electronics Co., Ltd., Suwon-si (KR)

(72) Inventors: Heegeun Park, Suwon-si (KR); Kyungho Lee, Suwon-si (KR); Jangho Moon, Hwaseong-si (KR); Minchul Lee, Seongnam-si (KR); Soyoung Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 380 days.

(21) Appl. No.: 17/328,249

(22) Filed: May 24, 2021

(65) Prior Publication Data

US 2022/0093665 A1 Mar. 24, 2022

(30) Foreign Application Priority Data

Sep. 18, 2020 (KR) .......................... 10-2020-0120814

(51) Int. Cl.
  *H04N 5/378* (2011.01)
  *H01L 27/146* (2006.01)

(52) U.S. Cl.
  CPC .. *H01L 27/14621* (2013.01); *H01L 27/14627* (2013.01); *H01L 27/1463* (2013.01)

(58) Field of Classification Search
  None
  See application file for complete search history.

(56) References Cited

U.S. PATENT DOCUMENTS

| | | | |
|---|---|---|---|
| 10,070,042 B2 | 9/2018 | Nikkanen et al. | |
| 10,244,158 B2 | 3/2019 | Fujii et al. | |
| 10,341,595 B2* | 7/2019 | Jung | H01L 27/14605 |
| 10,387,477 B2 | 8/2019 | Galor Gluskin et al. | |
| 2011/0019041 A1* | 1/2011 | Ishiwata | H01L 27/14621 257/E31.127 |
| 2013/0120644 A1 | 5/2013 | Fujii | |
| 2015/0015768 A1* | 1/2015 | Tanaka | H01L 27/14621 348/342 |
| 2018/0102389 A1 | 4/2018 | Lee | |
| 2019/0035838 A1* | 1/2019 | Byun | H01L 27/14605 |
| 2020/0013819 A1 | 1/2020 | Toda | |
| 2020/0105811 A1 | 4/2020 | Kim et al. | |
| 2020/0243578 A1* | 7/2020 | Pyo | H01L 27/1463 |
| 2021/0066359 A1* | 3/2021 | Yang | H01L 27/14605 |
| 2021/0358993 A1* | 11/2021 | Mao | H01L 27/1462 |
| 2021/0391363 A1* | 12/2021 | Ai | H01L 27/14605 |

FOREIGN PATENT DOCUMENTS

| | | |
|---|---|---|
| KR | 10-0703978 A | 1/2007 |
| KR | 10-2013-0108253 A | 10/2013 |
| KR | 10-2018-0040308 A | 4/2018 |
| KR | 10-2020-0038149 A | 4/2020 |

\* cited by examiner

*Primary Examiner* — Ali Naraghi
(74) *Attorney, Agent, or Firm* — Harness, Dickey & Pierce, P.L.C.

(57) ABSTRACT

Disclosed is an image sensor comprising a substrate that includes a plurality of pixel groups each including a plurality of pixel regions, a plurality of color filters two-dimensionally arranged on a first surface of the substrate, and a pixel separation structure in the substrate. The pixel separation structure includes a first part that defines each of the pixel regions and a second part connected to the first part. The second part runs across an inside of each of the pixel regions.

20 Claims, 18 Drawing Sheets

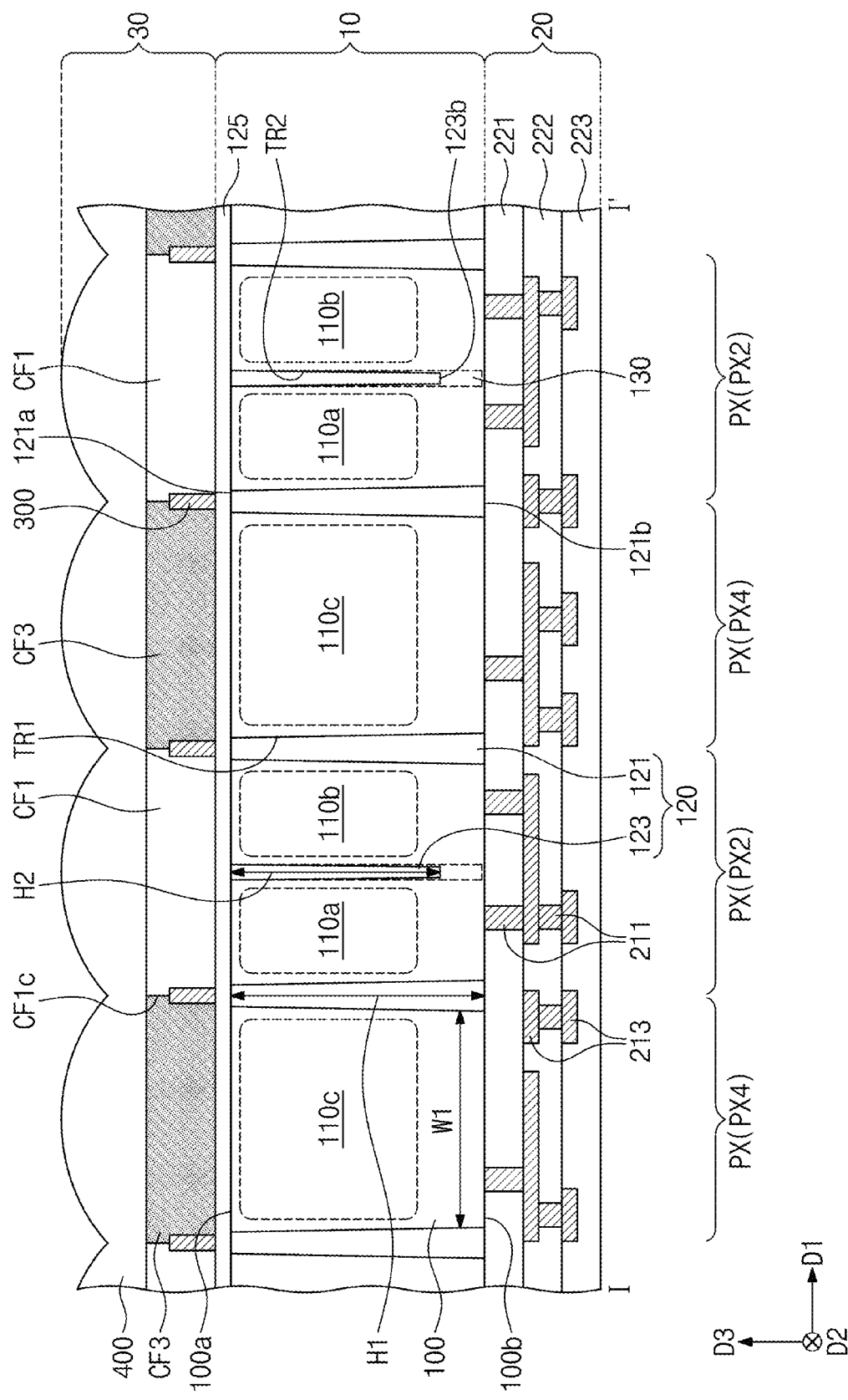

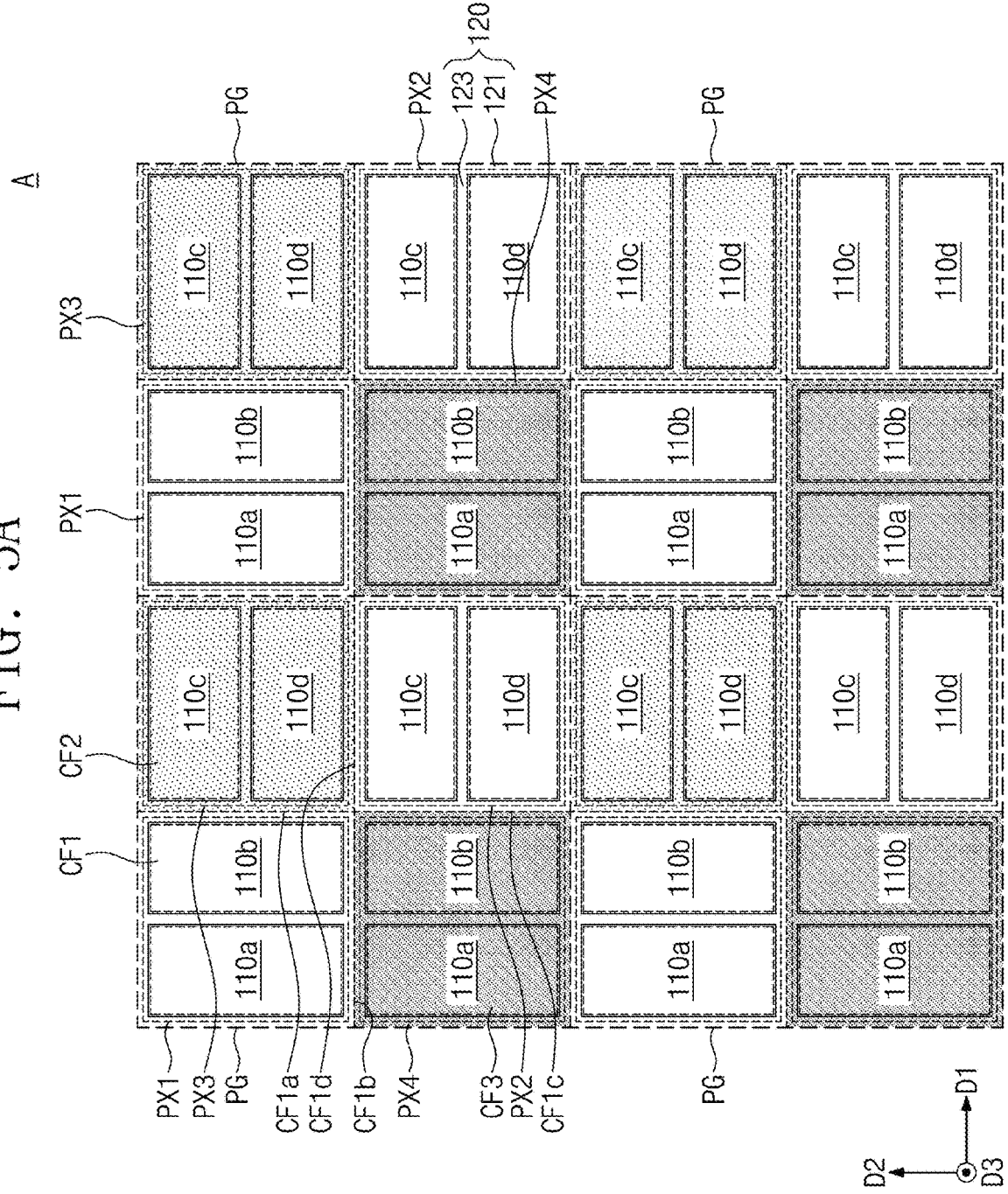

IMAGE SENSOR

CROSS-REFERENCE TO RELATED APPLICATION

This U.S. nonprovisional application claims priority under 35 U.S.C § 119 to Korean Patent Application No. 10-2020-0120814 filed on Sep. 18, 2020 in the Korean Intellectual Property Office, the disclosure of which is hereby incorporated by reference in its entirety.

BACKGROUND

Inventive concepts relate to an image sensor, and more particularly, to an image sensor capable of performing an auto-focus (AF) operation.

An image sensor converts photonic images into electrical signals. Recent advances in the computer and/or communication industries have led to strong demands in high performances image sensors in various consumer electronic devices such as at least one of digital cameras, camcorders, PCSs (personal communication systems), game consoles, security cameras, and medical micro-cameras.

An image sensor is classified into a charged coupled device (CCD) or a CMOS image sensor. The CMOS image sensor has a simple operating method, and a size of its product is possibly reduced and may be minimized because the CMOS image sensor's signal processing circuit is integrated into a single chip. Alternatively or additionally, the CMOS image sensor requires or uses relatively small power consumption, which is useful in battery-powered application. Alternatively or additionally, since process technology of manufacturing or fabricating CMOS image sensors is compatible with CMOS process technology, the CMOS image sensors can decrease in fabrication cost. Accordingly, the use of the CMOS image sensor has been rapidly increasing as a result of advance in technology and implementation of high resolution.

SUMMARY

Some example embodiments of inventive concepts provide an image sensor with improved optical and electrical characteristics.

Objects of inventive concepts are not limited to the mentioned above, and other objects which have not been mentioned above will be clearly understood to those of ordinary skill in the art from the following description.

According to some example embodiments of inventive concepts, an image sensor may comprise a substrate including a plurality of pixel groups, each of the plurality of pixel groups including a plurality of pixel regions, a plurality of color filters two-dimensionally arranged on a first surface of the substrate, and a pixel separation structure in the substrate. The pixel separation structure includes a first part defining each of the plurality of pixel regions, and a second part connected to the first part and running across an inside of each of the plurality of pixel regions. The plurality of color filters include a pair of first color filters transparent to a first light, one of the pair of first color filters spaced apart from the other one of the pair of first color filters, a second color filter transparent to a second light and contacting one lateral surface of the one of the pair of first color filters and one lateral surface of the other one of the pair of first color filters, and a third color filter transparent to a third light and contacting another lateral surface of the one of the pair of first color filters and another lateral surface of the other of the pair of first color filters. Each of the pixel groups includes a first pixel region, a second pixel region, a third pixel region adjacent to the first pixel region and the second pixel region, and a fourth pixel region adjacent to the first pixel region and the second pixel region, the second part of the pixel separation structure in each of the first and second pixel regions extends in a first direction parallel to the first surface of the substrate, and the second part of the pixel separation structure in each of the third and fourth pixel regions extend in a second direction intersecting the first direction.

According to some example embodiments of inventive concepts, an image sensor may comprise a substrate including a first pixel group, a second pixel group, a third pixel group, and a fourth pixel group, each of the first to fourth pixel groups including a first pixel region, a second pixel region, a third pixel region adjacent to the first pixel region and the second pixel region, and a fourth pixel region adjacent to the first pixel region and the second pixel region, a plurality of color filters two-dimensionally arranged on a first surface of the substrate, and a pixel separation structure in the substrate. The pixel separation structure includes a first part defining each of the first to fourth pixel regions, and a second part connected to the first part and across an inside of each of the first to fourth pixel regions. The plurality of color filters include a pair of first color filters transparent to a first light, one of the pair of first color filters spaced apart from the other one of the pair of first color filters, a second color filter transparent to a second light and contacting one lateral surface of the one of the pair of first color filters and with one lateral surface of the other one of the pair of first color filters, and a third color filter transparent to a third light and contacting another lateral surface of the one of the pair of first color filters and with another lateral surface of the other one of the pair of first color filters. Each of the plurality of color filters extends horizontally and covers a corresponding one of the first to fourth pixel regions, the second part of the pixel separation structure in each of the first and second pixel regions extends in a first direction parallel to the first surface of the substrate, and the second part of the pixel separation structure in each of the third and fourth pixel regions extends in a second direction intersecting the first direction.

According to some example embodiments of inventive concepts, an image sensor may comprise a substrate including a first pixel group, a second pixel group, a third pixel group, and a fourth pixel group, each of the first to fourth pixel groups including a first pixel region, a second pixel region, a third pixel region adjacent to the first pixel region and the second pixel region, and a fourth pixel region adjacent to the first pixel region and the second pixel region, a plurality of color filters two-dimensionally arranged on a first surface of the substrate, and a pixel separation structure in the substrate. The pixel separation structure includes a first part defining each of the first to fourth pixel regions, and a second part connected to the first part and running across an inside of each of the first to fourth pixel regions. The plurality of color filters include a pair of first color filters transparent to a first light, one of the pair of first color filters spaced apart from the other one of the pair of first color filters, a second color filter transparent to a second light and contacting one lateral surface of the one of the pair of first color filters and one lateral surface of the other one of the pair of first color filters, and a third color filter transparent to a third light and contacting another lateral surface of the one of the pair of first color filters and another lateral surface of the other one of the pair of first color filters. Each of the plurality of color filters extends horizontally and covers a corresponding one of the first to fourth pixel regions, and the second part of the pixel separation structure in each of the first to fourth pixel regions is parallel to one of a first direction and a second direction that intersects the first direction, the first direction being parallel to the first surface of the substrate.

BRIEF DESCRIPTION OF THE DRAWINGS

FIG. 3B illustrates a cross-sectional view taken along line I-I' of FIG. 2A, showing an image sensor according to some example embodiments of inventive concepts.

FIG. 5A illustrates a plan view of section A depicted in FIG. 1, showing an image sensor according to some example embodiments of inventive concepts.

DETAILED DESCRIPTION OF SOME EXAMPLE EMBODIMENTS

Figure 1:
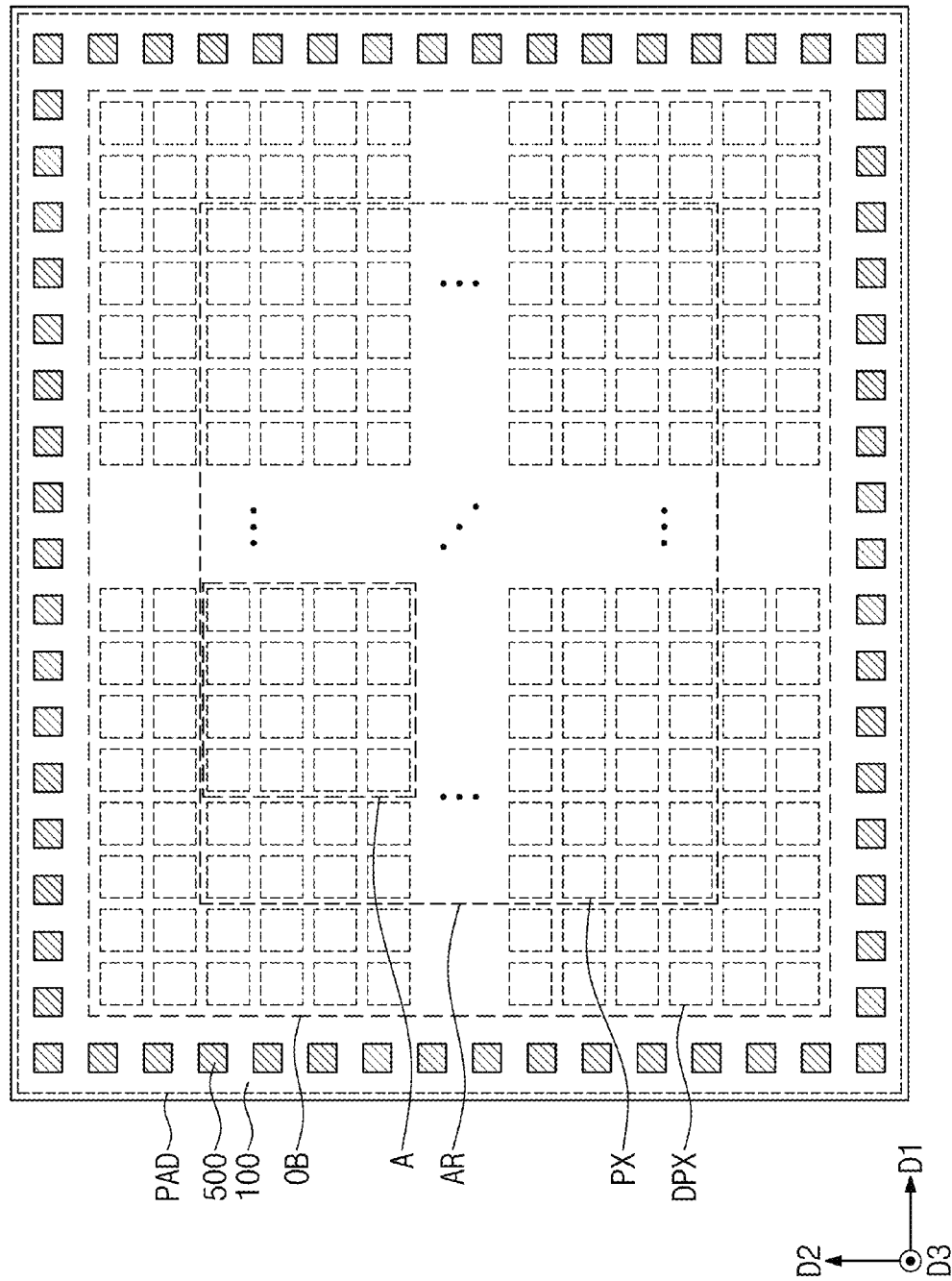
FIG. 1 illustrates a plan view showing an image sensor according to some example embodiments of inventive concepts.

In this description, like reference numerals may indicate like components. The following will now describe an image sensor according to some example embodiments of inventive concepts.

Figure 2A:
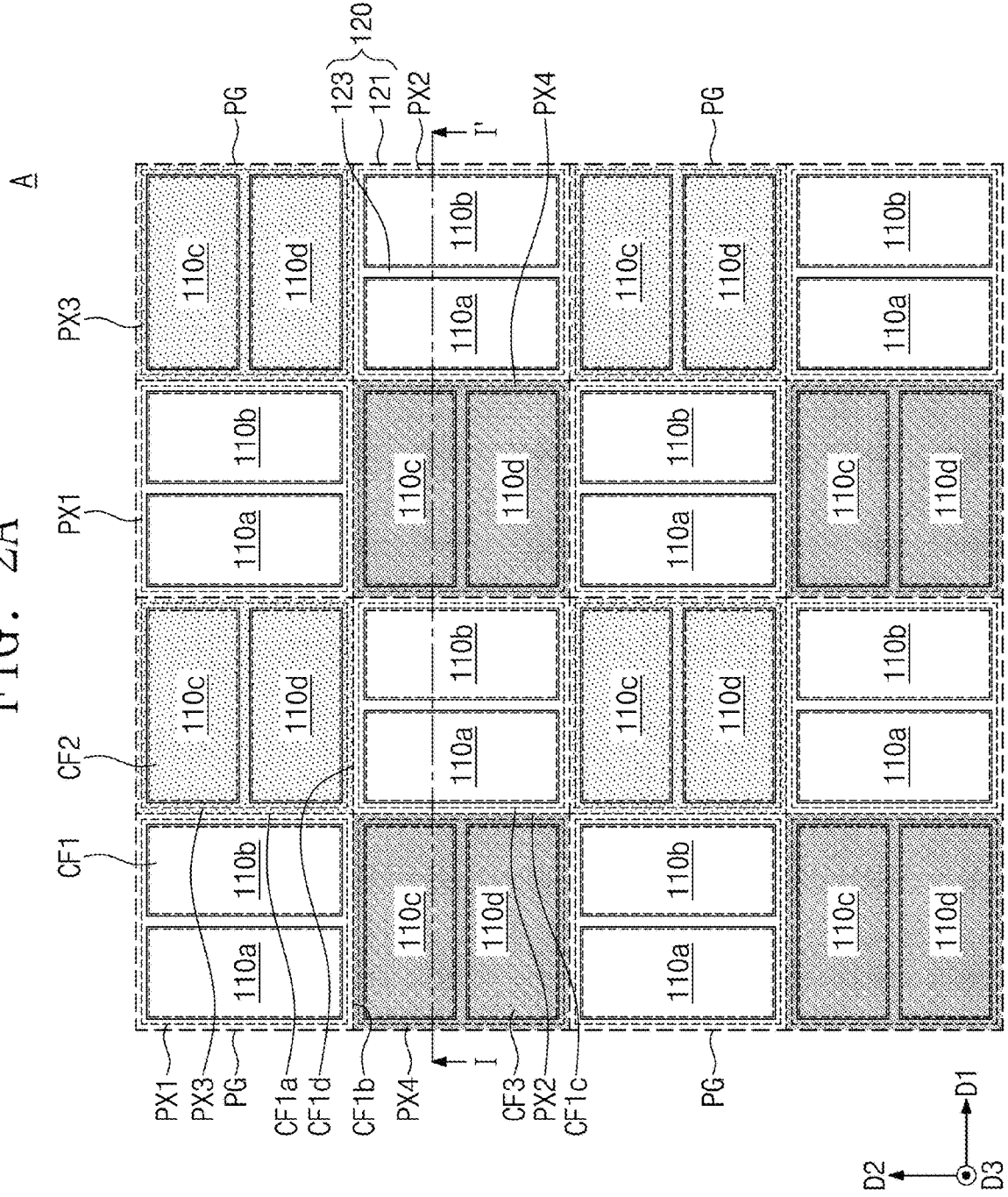
FIG. 2A illustrates an enlarged plan view showing section A of FIG. 1.
Figure 3A:
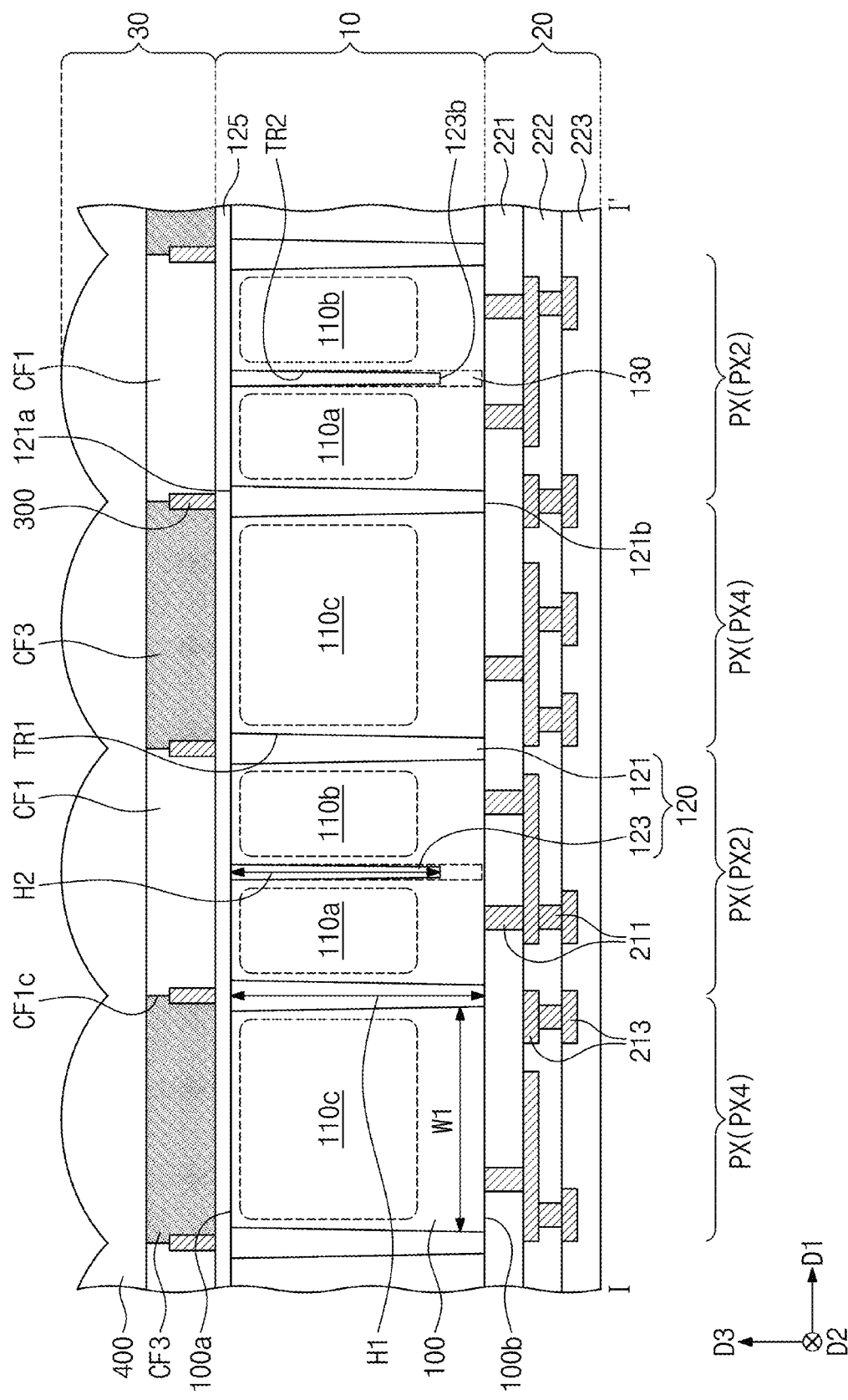
FIG. 3A illustrates a cross-sectional view taken along line I-I' of FIG. 2A.
Figure 3C:
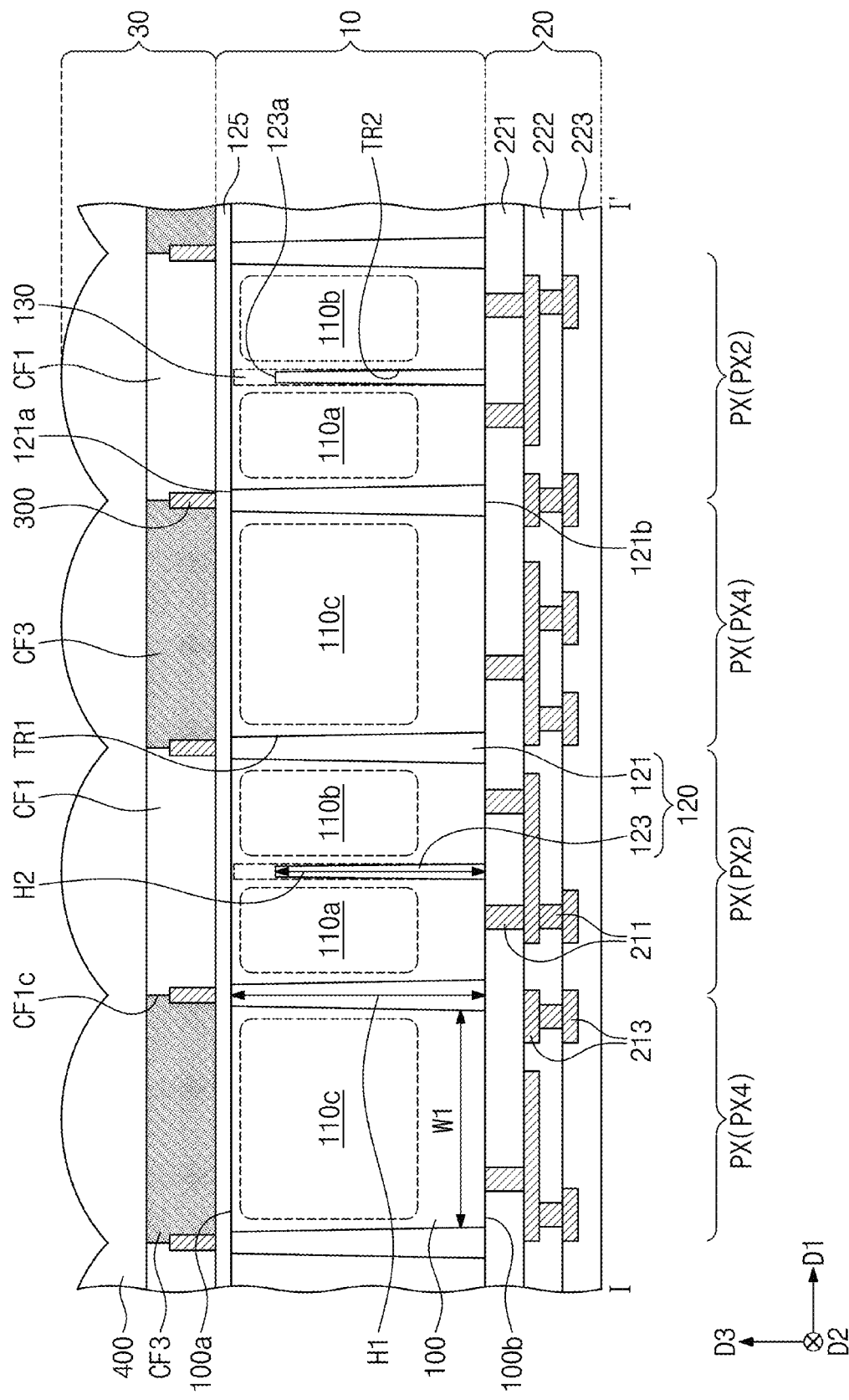
FIG. 3C illustrates a cross-sectional view taken along line I-I' of FIG. 2A, showing an image sensor according to some example embodiments of inventive concepts.

FIG. 1 illustrates a plan view showing an image sensor according to some example embodiments of inventive concepts. FIG. 2A illustrates an enlarged plan view showing section A of FIG. 1. FIG. 3A illustrates a cross-sectional view taken along line I-I' of FIG. 2A. FIG. 3B illustrates a cross-sectional view taken along line I-I' of FIG. 2A, showing an image sensor according to some example embodiments of inventive concepts. FIG. 3C illustrates a cross-sectional view taken along line I-I' of FIG. 2A, showing an image sensor according to some example embodiments of inventive concepts.

Referring to FIG. 1, when viewed in plan view, a substrate 100 may include a pixel array region AR, an optical black region OB, and a pad region PAD. When viewed in plan view, the pixel array region AR may be disposed on a central portion of the substrate 100. The pixel array region AR may include a plurality of pixel regions PX. The pixel regions PX may output photoelectric signals from incident light. The pixel regions PX may be two-dimensionally arranged in columns and rows. The rows may extend in, e.g. be arranged in a first direction D1. The columns may extend in, e.g. be arranged in, a second direction D2. In this description, the first direction D1 may be parallel to a first surface 100a of the substrate 100. The second direction D2 may be parallel to the first surface 100a of the substrate 100 and may intersect the first direction D1. For example, the second direction D2 may be orthogonal or substantially orthogonal to, e.g. at right angles with, the first direction D1. A third direction D3 may be perpendicular or substantially perpendicular to the first surface 100a of the substrate 100.

The pad region PAD may be provided on an edge portion of the substrate 100, and when viewed in plan view, may surround the pixel array region AR. Second pad terminals 83 may be provided on the pad region PAD. The second pad terminals 83 may externally output electrical signals generated from the pixel regions PX. Alternatively or additionally, external electrical signals and/or voltages may be transferred through the second pad terminals 83 to the pixel regions PX. As the pad region PAD is disposed on the edge portion of the substrate 100, the second pad terminals 83 may be easily coupled to outside.

The optical black region OB may be disposed between the pixel array region AR and the pad region PAD of the substrate 100. When viewed in plan view, the optical black region OB may surround the pixel array region AR. The optical black region OB may include a plurality of dummy pixel regions DPX. The dummy pixel regions DPX may be or correspond to regions that generate signals that are used as information to remove subsequent process noise. The pixel array region AR of the image sensor will be further discussed in detail below with reference to FIGS. 2A to 3C.

Referring to FIGS. 2A and 3A, an image sensor according to some example embodiments of inventive concepts may include a photoelectric conversion layer 10, a wiring layer 20, and an optical transmittance layer 30. The photoelectric conversion layer 10 may include a substrate 100 and a pixel separation structure 120.

The substrate 100 may have a first surface 100a (e.g. a rear surface) and a second surface 100b (e.g. a front surface) that are opposite each other, e.g. that face each other. The substrate 100 may receive light incident on the first surface 100a. The wiring layer 20 may be disposed on the second surface 100b of the substrate 100, and the optical transmittance layer 30 may be disposed on the first surface 100a of the substrate 100. The substrate 100 may be a semiconductor substrate or a silicon-on-insulator (SOI) substrate. The semiconductor substrate may be or include, for example, a silicon substrate, a germanium substrate, and/or a silicon-germanium substrate, and may be a single-crystalline substrate. The substrate 100 may be lightly doped and may include first conductivity type impurities. For example, the first conductivity type impurities may include p-type impurities, such as one or more of aluminum (Al), boron (B), indium (In), and gallium (Ga).

The substrate 100 may include a plurality of pixel groups PG. Each of the pixel groups PG may be arranged in a repetitive matrix shape along a first direction D1 and a second direction D2 that intersect each other. Each of the pixel groups PG may include a plurality of pixel regions PX1, PX2, PX3, and PX4 that are defined by the pixel separation structure 120. Each of the pixel groups PG may have only four pixel regions; however, example embodiments are not limited thereto. For example, the plurality of pixel regions PX1, PX2, PX3, and PX4 may include a first pixel region PX1, a second pixel region PX2, a third pixel region PX3, and a fourth pixel region PX4. The first, second, third, and fourth pixel regions PX1, PX2, PX3, and PX4 may be spaced apart from each other across the pixel separation structure 120. The first, second, third, and fourth pixel regions PX1, PX2, PX3, and PX4 of each pixel group PG may have a two-by-two arrangement when viewed in plan view. For example, the first and third pixel regions PX1 and PX3 may be aligned in the first direction D1, and the first and fourth pixel regions PX1 and PX4 may be aligned in the second direction D2. The first and second pixel regions PX1 and PX2 may not be aligned in the first and second directions D1 and D2. The first pixel region PX1 may be arranged cater-corner with, e.g. diagonally with, the second pixel region PX2 and the third pixel region PX3 may be arranged cater-corner with, e.g. diagonally with, the fourth pixel region PX4. For example, the second and third pixel regions PX2 and PX3 may be aligned in the second direction D2 and may share a common border, and the second and fourth pixel regions PX2 and PX4 may be aligned in the first direction D1 and may share a common border. Each of the first, second, third, and fourth pixel regions PX1, PX2, PX3, and PX4 may have a width W1 of about 1 μm, e.g. 1 μm to about 1.4 μm, e.g. 1.4 μm, in the first direction D1, and may have the same width or may have different widths; however example embodiments are not limited thereto. A single pixel group PG will be explained below for convenience of description.

The substrate 100 may include first, second, third, and fourth photoelectric conversion regions 110a, 110b, 110c, and 110d. The first, second, third, and fourth photoelectric conversion regions 110a, 110b, 110c, and 110d may be provided in the first, second, third, and fourth pixel regions PX1, PX2, PX3, and PX4. For example, at least one selected from the first, second, third, and fourth pixel regions PX1, PX2, PX3, and PX4 may include the first photoelectric conversion region 110a and the second photoelectric conversion region 110b, but may not include the third photoelectric conversion region 110c or the fourth photoelectric conversion region 110d. Alternatively or additionally, at least one selected from the first, second, third, and fourth pixel regions PX1, PX2, PX3, and PX4 may include the third photoelectric conversion region 110c and the fourth photoelectric conversion region 110d but may not include the first photoelectric conversion region 110a or the second photoelectric conversion region 110b. The first and/or the second photoelectric conversion regions 110a and 110b may detect a phase difference of light that is incident differently along the first direction D1. Signals output from the first and second photoelectric conversion regions 110a and 110b may be compared with each other to calculate an auto-focus signal that controls, or is used to control, positions of a lens. The third and fourth photoelectric conversion regions 110c and 110d may detect a phase difference of light that is incident differently along the second direction D2. Signals output from the third and/or fourth photoelectric conversion regions 110c and 110d may be compared with each other to calculate an auto-focus signal that controls, or is used to control, positions of a lens.

The first, second, third, and fourth photoelectric conversion regions 110a, 110b, 110c, and 110d may each be or correspond to an area having or doped with second conductivity type impurities. The second conductivity type impurities may have a conductivity type opposite to that of the first conductivity type impurities. The second conductivity type impurities may include n-type impurities, such as one or more of phosphorus, arsenic, bismuth, and antimony. Each of the one or more impurities may have the same, or different, concentrations and/or profiles. The first, second, third, and fourth photoelectric conversion regions 110a, 110b, 110c, and 110d may be adjacent to the first surface 100a of the substrate 100. For example, the first, second, third, and fourth photoelectric conversion regions 110a, 110b, 110c, and 110d may be closer to the first surface 100a that to the second surface 100b. Each of the photoelectric conversion regions 110 may include a first region adjacent to the first surface 100a and a second region adjacent to the second surface 100b. The photoelectric conversion region 110 may have a difference in impurity concentration between, e.g. a decrease or an increase in impurity concentrations between, the first region and the second region. Therefore, the photoelectric conversion region 110 may have a potential slope between the first and second surfaces 100a and 100b of the substrate 100. Alternatively or additionally, the photoelectric conversion region 110 may have no potential slope between the first and second surfaces 100a and 100b of the substrate 100, e.g. may have a uniform concentration of impurities.

The substrate 100 and each of the first, second, third, and fourth photoelectric conversion regions 110a, 110b, 110c, and 110d may constitute or correspond to a photodiode. For example, a photodiode may be constituted by or correspond to or be formed by a p-n junction between the substrate 100 having a first conductivity type and each of the first, second, third, and fourth photoelectric conversion region 110a, 110b, 110c, and 110d each having a second conductivity type. The first, second, third, and fourth photoelectric conversion region 110a, 110b, 110c, and 110d each constituting or corresponding to the photodiode may generate and/or accumulate photo-charges in proportion to intensity of incident light.

Each of first to fourth pixel regions PX1 to PX4 may include a dummy impurity region 130 between the second surface 100b of the substrate 100 and a second part 123 of the pixel separation structure 120. The dummy impurity region 130 may be formed by doping, e.g. by ion-implanting, the substrate 100 with impurities having the same conductivity type (e.g., p-type) as that of the substrate 100. The concentration of impurities in the dummy impurity region 130 having the same conductivity type as that of the substrate may be larger than the concentration of impurities of the substrate; however, example embodiments are not limited thereto. The dummy impurity region 130 may form or help to form a potential barrier to split incident light into two or more beams provided to the first and second photoelectric conversion regions 110a and 110b or to the third and fourth photoelectric conversion regions 110c and 110d.

Referring still to FIGS. 2A and 3A, the pixel separation structure 120 may be provided in the substrate 100. The pixel separation structure 120 may include, for example, one or more of silicon oxide, silicon nitride, silicon oxynitride, doped or undoped polycrystalline silicon, amorphous silicon, and metal. The metal may include, for example, tungsten.

A first part 121 of the pixel separation structure 120 may define the first, second, third, and fourth pixel regions PX1, PX2, PX3, and PX4. When viewed in plan view, the first part 121 of the pixel separation structure 120 may be interposed between the first, second, third, and fourth pixel regions PX1, PX2, PX3, and PX4. The first part 121 of the pixel separation structure 120 may have a grid and/or lattice structure when viewed in plan. The first part 121 of the pixel separation structure 120 may enclose, e.g. may completely enclose each of the first, second, third, and fourth pixel regions PX1, PX2, PX3, and PX4. The first part 121 of the pixel separation structure 120 may be provided in a first trench TR1, which first trench TR1 may be recessed from the first surface 100a of the substrate 100. The first part 121 of the pixel separation structure 120 may extend from the first surface 100a toward the second surface 100b of the substrate 100, e.g. may extend the thickness of the substrate in the third direction D3. The first part 121 of the pixel separation structure 120 may be or correspond to a deep trench isolation layer. The first part 121 of the pixel separation structure 120 may penetrate the substrate 100. The first part 121 of the pixel separation structure 120 may have a vertical height H1 substantially the same as a vertical thickness of the substrate 100. For example, the first part 121 of the pixel separation structure 120 may have a width in the first direction D1 that gradually decreases, e.g. that tapers, as the first part 121 approaches the second surface 100b from the first surface 100a of the substrate 100. The first part 121 of the pixel separation structure 120 may fill the first trench TR1 and may include, for example, one or more of silicon oxide, silicon nitride, silicon oxynitride, doped or undoped polycrystalline silicon, amorphous silicon, and metal. The metal may include, for example, tungsten.

Alternatively or additionally, according to some example embodiments, the first part 121 of the pixel separation structure 120 may penetrate a portion of, e.g. may extend only a portion of, the substrate 100. For example, the first part 121 may have a bottom surface that is spaced apart from the second surface 100b of the substrate 100 and is located within the substrate 100, e.g. at a higher level than that of the second surface 100b of the substrate 100. In this case, a dummy impurity region may be provided between the bottom surface of the first part 121 and the second surface 100b of the substrate 100. The dummy impurity region may be formed by ion-implanting the substrate 100 with impurities having the same conductivity type (e.g., p-type) as that of the substrate 100. The dummy impurity region may be doped with the same, or different, impurities than the dummy impurity region 130.

The second part 123 of the pixel separation structure 120 may be provided in a second trench TR2. The second trench TR2 may be recessed from the first surface 100a of the substrate 100. The second part 123 may not extend the thickness of the substrate 100.

The second part 123 of the pixel separation structure 120 may vertically extend from the first surface 100a toward the second surface 100b of the substrate 100. The first and second trenches TR1 and TR2 may all be formed recessed from the first surface 100a of the substrate 100. The second part 123 of the pixel separation structure 120 may penetrate a portion of, e.g. may not extend the entirety of, the substrate 100. The second part 123 of the pixel separation structure 120 may have a bottom surface 123b spaced apart from the second surface 100b of the substrate 100. The bottom surface 123b of the second part 123 included in the pixel separation structure 120 may be located within the substrate 100, e.g. at a higher level than that of the second surface 100b of the substrate 100. The second part 123 of the pixel separation structure 120 may have a vertical height H2 less than the vertical height H1 of the first part 121.

Referring to FIG. 3B, according to some example embodiments, the first part 121 of the pixel separation structure 120 may have a width in the first direction D1 that gradually decreases, e.g. that tapers, as the first part 121 approaches the first surface 100a from the second surface 100b of the substrate 100. The first part 121 of the pixel separation structure 120 may be provided in the first trench TR1, which first trench TR1 may be recessed from the second surface 100b of the substrate 100. The first part 121 of the pixel separation structure 120 may extend from the second surface 100b toward the first surface 100a of the substrate 100. The first part 121 may include, for example, one or more of silicon oxide, silicon nitride, silicon oxynitride, doped or undoped polysilicon, amorphous silicon, and metal. The metal may include, for example, tungsten. The first part 121 may include a single layer or a plurality of layers including or consisting of different materials, but inventive concepts are not limited thereto.

The second part 123 of the pixel separation structure 120 may be provided in the second trench TR2. For example, the first trench TR1 may be formed recessed from the second surface 100b of the substrate 100, and the second trench TR2 may be formed recessed from the first surface 100a of the substrate 100.

Referring to FIG. 3C, according to some example embodiments, the first and second trenches TR1 and TR2 may all be formed recessed from the second surface 100b of the substrate 100. The first part 121 of the pixel separation structure 120 may have a width in the first direction D1 that gradually decreases, e.g. that tapers, as the first part 121 approaches the first surface 100a from the second surface 100b of the substrate 100. The first part 121 of the pixel separation structure 120 may be provided in the first trench TR1 and may extend from the second surface 100b toward the first surface 100a of the substrate 100.

The second part 123 of the pixel separation structure 120 may be provided in the second trench TR2. The second part 123 of the pixel separation structure 120 may vertically extend from the second surface 100b toward the first surface 100a of the substrate 100. The second part 123 of the pixel separation structure 120 may penetrate a portion of, e.g. may not extend the entirety of, the substrate 100. The second part 123 of the pixel separation structure 120 may have a top surface 123a spaced apart from the first surface 100a of the substrate 100. For example, the top surface 123a of the second part 123 included in the pixel separation structure 120 may be provided between the first and second surfaces 100a and 100b of the substrate 100. Example embodiments are not limited thereto, and each of FIGS. 3A to 3C are not meant to be mutually exclusive. For example, a CMOS image sensor according to some example embodiments may have some features of FIG. 3A, some features of FIG. 3B, and some features of FIG. 3C. For example, some example embodiments may have a dummy impurity region 130 closer to the first surface 100a of the substrate 100, and a first part 121 of the pixel separation structure 120 may have a decreasing width, e.g. may taper, from the first surface 100a to the second surface 100b.

When viewed in plan view, the pixel separation structure 120 may be configured such that the second part 123 may be connected to the first part 121 and may run across an inside of each of the first, second, third, and third pixel regions PX1, PX2, PX3, and PX4. The second part 123 of the pixel separation structure 120 may be interposed between the first and second photoelectric conversion regions 110a and 110b and between the third and fourth photoelectric conversion regions 110c and 110d. A planar arrangement of the second part 123 of the pixel separation structure 120 will be further discussed in detail below.

The wiring layer 20 may include wiring dielectric layers 221, 222, and 223, vias 211, and wiring lines 213. The wiring dielectric layers 221, 222, and 223 may include a first dielectric layer 221, a second dielectric layer 222, and a third dielectric layers 223. The first dielectric layer 221 may cover the second surface 100b of the substrate 100. The first dielectric layer 221 may be provided between the wiring lines 213 and the second surface 100b of the substrate 100, thereby covering gate electrodes (not shown). The second and third dielectric layers 222 and 223 may be stacked on the first dielectric layer 221. The first, second, and third dielectric layers 221, 222, and 223 may include a non-conductive material. For example, the first, second, and third dielectric layers 221, 222, and 223 may include an insulating material such as a silicon-based dielectric material, such as one or more of silicon oxide, silicon nitride, and silicon oxynitride.

The wiring lines 213 may be provided on the first dielectric layer 221. For example, the wiring lines 213 may be disposed in the second and third dielectric layers 222 and 223 that are stacked on the second surface 100b of the substrate 100. The wiring lines 213 may be vertically connected through the vias 211 to transistors (not shown). The wiring layer 20 may signal-process electrical signals converted in the first, second, third, and fourth photoelectric conversion regions 110a, 110b, 110c, and 110d. In some example embodiments of inventive concepts, an arrangement of the wiring lines 213 may not depend on an arrangement of the first, second, third, and fourth photoelectric conversion regions 110a, 110b, 110c, and 110d. For example, when viewed in plan, the wiring lines 213 may run across the first, second, third, and fourth photoelectric conversion regions 110a, 110b, 110c, and 110d. The wiring lines 213 and the vias 211 may include a metallic material, such as one or more of copper (Cu), aluminum (Al), and tungsten (W).

The optical transmittance layer 30 may include color filters CF1, CF2, and CF3 and micro-lenses 400. The optical transmittance layer 30 may focus and/or filter externally incident light, and the photoelectric conversion layer 10 may be provided with the focused and filtered light.

The color filters CF1, CF2, and CF3 and the micro-lenses 400 may be provided on the first surface 100a of the substrate 100. The color filters CF1, CF2, and CF3 and the micro-lenses 400 may each be disposed to correspond to one of the first, second, third, and fourth pixel regions PX1, PX2, PX3, and PX4. A dielectric layer, e.g. a planarized dielectric layer 125 may be interposed between the first surface 100a of the substrate 100 and the color filters CF1, CF2, and CF3. The planarized dielectric layer 125 may include at least one selected from a bottom antireflective coating (BARC) layer, a fixed charge layer, an adhesive layer, and a protective layer. When the planarized dielectric layer 125 serves as a bottom antireflective coating (BARC) layer, the planarized dielectric layer 125 may prevent or reduce the amount or likelihood of reflection of light so as to allow the first to fourth photoelectric conversion regions 110a to 110d to readily receive light incident on the first surface 100a of the substrate 100. The planarized dielectric layer 125 may include or consist of metal oxide (e.g., aluminum oxide and/or hafnium oxide) and/or silicon-based dielectric (e.g., silicon oxide or silicon nitride).

The color filters CF1, CF2, and CF3 may each be disposed to correspond to one of the first, second, third, and fourth pixel regions PX1, PX2, PX3, and PX4.

The color filters CF1, CF2, and CF3 may include a pair of first color filters CF1, a second color filter CF2 between the pair of first color filters CF1, and a third color filter CF3 between the pair of first color filters CF1. The pair of first color filters CF1 may vertically overlap with each of the first pixel region PX1 and the second pixel region PX2. The pair of first color filters CF1 may be transparent to a first light. The pair of first color filters CF1 may be diagonally spaced apart from each other.

The second color filter CF2 may be disposed between the pair of first color filters CF1. For example, the second color filter CF2 may be adjacent to one lateral surface CF1a of one of the pair of first color filters CF1 and to one lateral surface CF1d of the other of the pair of first color filters CF1. The second color filter CF2 may vertically overlap the third pixel region PX3. The second color filter CF2 may be transparent to a second light different from the first light.

The third color filter CF3 may be disposed between the pair of first color filters CF1. For example, the third color filter CF3 may be adjacent to another lateral surface CF1b of the one of the pair of first color filters CF1 and to another lateral surface CF1c of the other of the pair of first color filters CF1. The third color filter CF3 may vertically overlap the fourth pixel region PX4. The third color filter CF3 may be transparent to a third light different from both the first light and the second light.

Each of the color filters CF1, CF2, and CF3 may include one of red, green, and blue color filters. For example, the pair of first color filters CF1 may be or include green color filters, the second color filter CF2 may be or include a red color filter, and the third color filter CF3 may be or include a blue color filter. Accordingly, the first, second, third, and fourth pixel regions PX1, PX2, PX3, and PX4 may include red pixels including red color filters, blue pixels including blue color filters, and green pixels including green color filters. The red pixel may be configured such that the red color filter may allow red visible light to pass therethrough, and the photoelectric conversion component of the red pixel may generate photoelectrons which correspond to the red visible light. The blue pixel may be configured such that the blue color filter may allow blue visible light to pass therethrough, and the photoelectric conversion component of the blue pixel may generate photoelectrons which correspond to the blue visible light. The green pixel may be configured such that the green filter may allow green visible light to pass therethrough, and the photoelectric conversion component of the green pixel may generate photoelectrons which correspond to the green visible light. However, example embodiments are not limited to the above color pixels. For example, the color filters CF1, CF2, and CF3 may include magenta, yellow, and cyan color filters.

For example, the color filters CF1, CF2, and CF3 may be arranged in a Bayer pattern in which the number of green color filters is greater than twice the number of red color filters or blue color filters. In the Bayer pattern, the color filters CF1, CF2, and CF3 disposed in a two-by-two arrangement may constitute, correspond to, or be included in a single color filter group, and the single color filter group may include two green color filters that are disposed diagonally (e.g. cater-corner with each other) and also include a blue color filter and a red color filter that are disposed diagonally (e.g. cater-corner with each other). For example, each of the red and blue color filters may be disposed between neighboring green color filters. The Bayer-patterned color filter group may be repeatedly arrayed along the first direction D1 and the second direction D2.

A grid pattern 300 may be disposed between the color filters CF1, CF2, and CF3. Similar to the first part 121 of the pixel separation structure 120, the grid pattern 300 may have a grid or lattice shape when viewed in plan. The grid pattern 300 may include a metallic material, such as tungsten and/or aluminum. For example, the grid pattern 300 may have a bi-layered structure including a tungsten layer and a tungsten nitride layer.

The micro-lenses 400 may be correspondingly disposed on top surfaces of the color filters CF1, CF2, and CF3. The micro-lenses 400 may correspondingly vertically overlap the first, second, third, and fourth pixel regions PX1, PX2, PX3, and PX4. Each of the micro-lenses 400 may vertically overlap either the first and second photoelectric conversion regions 110a and 110b or the third and fourth photoelectric conversion regions 110c and 110d. Differently from that shown, the micro-lenses 400 may be separated from each other, but inventive concepts are not limited thereto. The micro-lenses 400 may be transparent to allow light to pass therethrough. The micro-lenses 400 may have their convex shapes to condense light incident on the first, second, third, and fourth pixel regions PX1, PX2, PX3, and PX4. The micro-lenses 400 may include an organic material. For example, the micro-lenses 400 may include a photoresist material and/or a thermosetting resin.

According to some example embodiments, when viewed in plan, the pixel separation structure 120 may be configured such that the second part 123 provided in the first pixel region PX1 may be aligned in the second direction D2, and that the second part 123 provided in the second pixel region PX2 may be aligned in the second direction D2. Each of the first and second pixel regions PX1 and PX2 may include the first photoelectric conversion region 110a and the second photoelectric conversion region 110b that are spaced apart from each other across the second part 123 of the pixel separation structure 120. The first and second photoelectric conversion regions 110a and 110b may extend parallel to the second part 123 and may have their major axes in the second direction D2.

The pixel separation structure 120 may be configured such that the second part 123 provided in the third pixel region PX3 may be aligned in the first direction D1, and that the second part 123 provided in the fourth pixel region PX4 may be aligned in the first direction D1. Each of the third and fourth pixel regions PX3 and PX4 may include the third photoelectric conversion region 110c and the fourth photoelectric conversion region 110d that are spaced apart from each other across the second part 123 of the pixel separation structure 120. The third and fourth photoelectric conversion regions 110c and 110d may extend parallel to the second part 123 and may have their major axes in the first direction D1.

The first and second photoelectric conversion regions 110a and 110b may achieve phase difference detection for incident light. For example, the first and second pixel regions PX1 and PX2 each including the first and second photoelectric conversion regions 110a and 110b may calculate a phase difference of light and thus may output a focus signal that corresponds to the phase difference. The focus signal may be used to adjust positions of a lens included in a device including an image sensor according to some example embodiments. Thus, the device may perform an auto-focus (AF) operation.

When, in addition to the first and second photoelectric conversion regions 110a and 110b, the third and fourth photoelectric conversion regions 110c and 110d are further included as discussed in inventive concepts, more precisely calculating not only a phase difference of light that is incident differently along the first direction D1, but a phase difference of light that is incident differently along the second direction D2 may be possible. Accordingly, an image sensor may be provided to have an improved auto-focus operation.

Figure 2B:
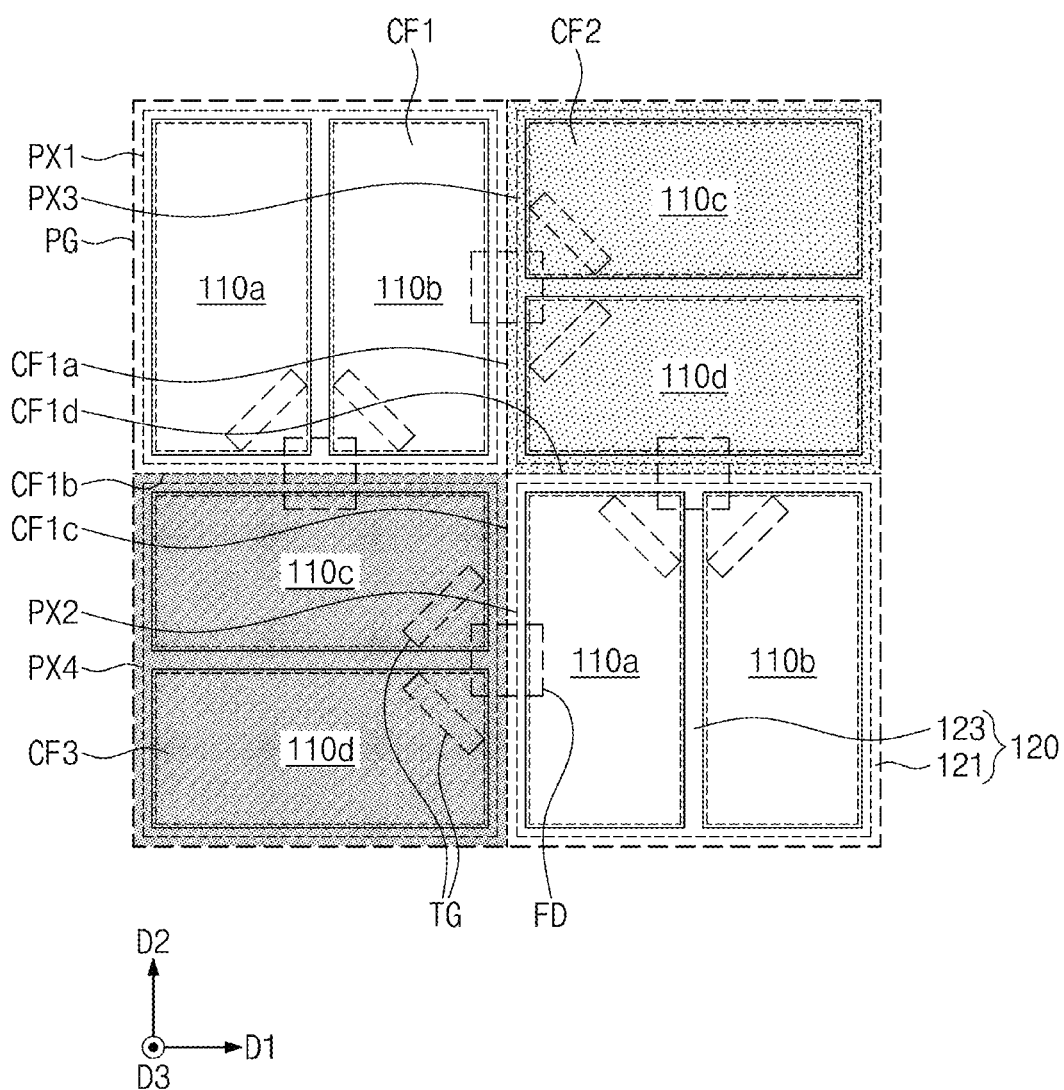
FIG. 2B illustrates a plan view showing one of pixel groups depicted in FIG. 2A.

FIG. 2B illustrates a plan view showing one of pixel groups depicted in FIG. 2A.

Referring to FIG. 2B, a plurality of floating diffusion regions FD may be included in the substrate 100 provided in a single pixel group PG. For example, floating diffusion regions FD may be disposed in a single pixel group PG. The floating diffusion regions FD may each be an area where second conductivity type impurities are doped/incorporated in the substrate 100. The second conductivity type impurities may have a conductivity type opposite to that of the first conductivity type impurities. The second conductivity type impurities may include n-type impurities, such as one or more of phosphorus (P), arsenic (As), bismuth (Bi), and antimony (Sb), at the same or different concentrations and at the same or different depths.

When viewed in plan, the floating diffusion region FD may be disposed to overlap a corresponding one of a boundary between the first and second pixel regions PX1 and PX2, a boundary between the second and third pixel regions PX2 and PX3, a boundary between the third and fourth pixel regions PX3 and PX4, and a boundary between the fourth and first pixel regions PX4 and PX1. For example, each of the floating diffusion regions FD may be disposed to vertically overlap a point where the first part 121 of the pixel separation structure 120 is connected to the second part 123 of the pixel separation structure 120.

A plurality of transfer gate patterns TG may be provided in a single pixel group PG. The transfer gate patterns TG may include metal, metal silicide, doped or undoped polysilicon, or any combination thereof. When viewed in plan view, the transfer gate patterns TG may be adjacent to the floating diffusion regions FD. For example, a pair of transfer gate patterns TG may be adjacent to one floating diffusion region FD. A single pixel region PX may include a pair of transfer gate patterns TG. Each of the pair of transfer gate patterns TG may be disposed symmetrically to each other about the second part 123 of the pixel separation structure 120.

Figure 4A:
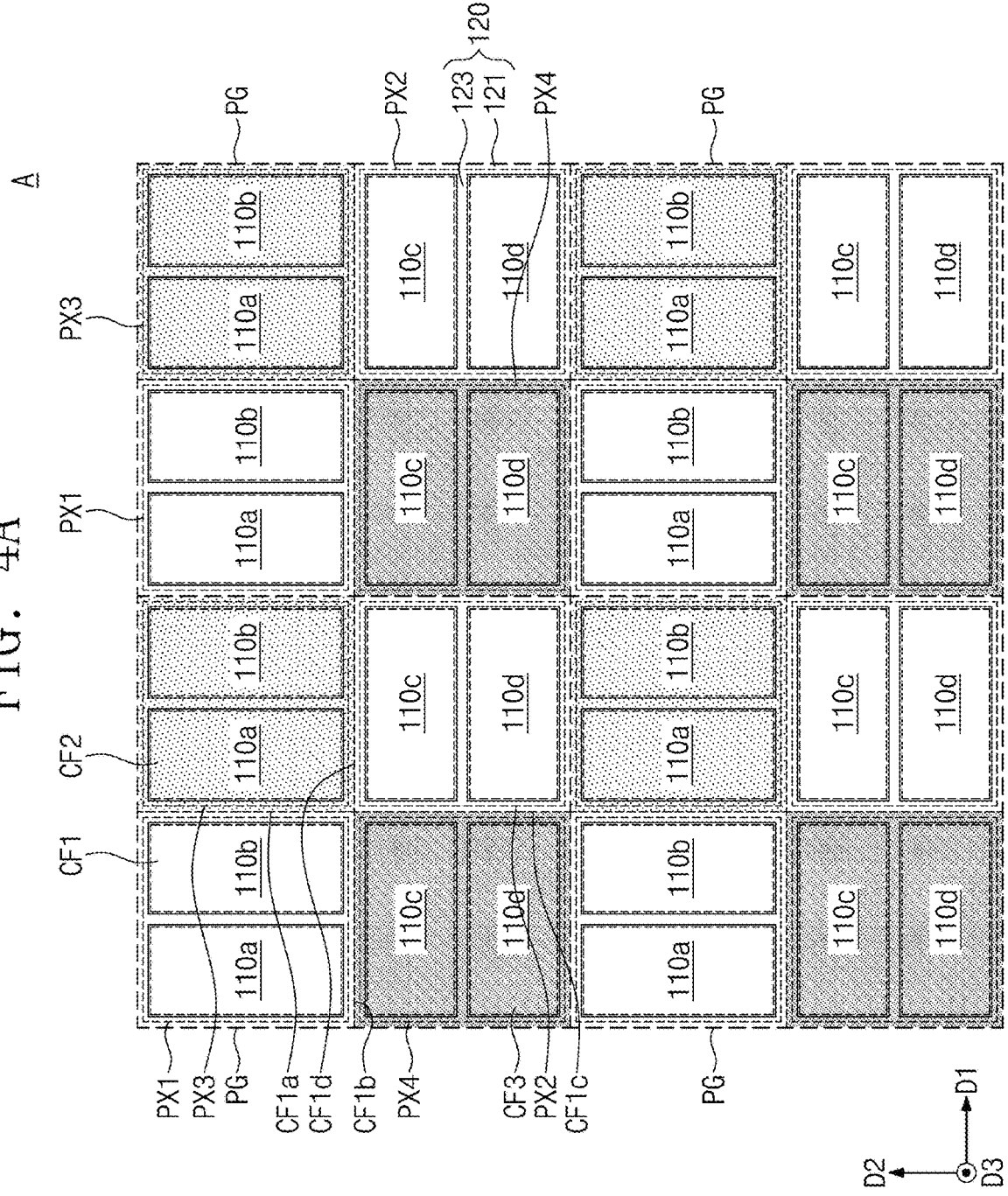
FIG. 4A illustrates a plan view of section A depicted in FIG. 1, showing an image sensor according to some example embodiments of inventive concepts.

FIG. 4A illustrates a plan view of section A depicted in FIG. 1, showing an image sensor according to some example embodiments of inventive concepts. A repetitive description on the same features will be omitted for brevity, and a difference from the mentioned above will be discussed in detail.

Referring to FIG. 4A, an image sensor according to some example embodiments of inventive concepts may include a photoelectric conversion layer 10, a wiring layer 20, and an optical transmittance layer 30. The photoelectric conversion layer 10 may include a substrate 100 and a pixel separation structure 120. The substrate 100, the wiring layer 20, and the optical transmittance layer 30 may be the same or substantially the same as those discussed with reference to FIGS. 2 and 3.

According to some example embodiments, when viewed in plan, the pixel separation structure 120 may be configured such that the second part 123 provided in the first pixel region PX1 may be aligned in the second direction D2, and that the second part 123 provided in the third pixel region PX3 may also be aligned in the second direction D2. Each of the first and third pixel regions PX1 and PX3 may include the first photoelectric conversion region 110a and the second photoelectric conversion region 110b that are spaced apart from each other across the second part 123 of the pixel separation structure 120. The first and second photoelectric conversion regions 110a and 110b may extend parallel to the second part 123 and may have their major axes in the second direction D2.

The pixel separation structure 120 may be configured such that the second part 123 provided in the second pixel region PX2 may be aligned in the first direction D1, and that the second part 123 provided in the fourth pixel region PX4 may also be aligned in the first direction D1. Each of the second and fourth pixel regions PX2 and PX4 may include the third photoelectric conversion region 110c and the fourth photoelectric conversion region 110d that are spaced apart from each other across the second part 123 of the pixel separation structure 120. The third and fourth photoelectric conversion regions 110c and 110d may extend parallel to the second part 123 and may have their major axes in the first direction D1.

A pixel region on which a color filter such as a green color filter is disposed may have sensitivity to incident light greater than that of a pixel region on which a color filter such as a red and/or blue color filter is disposed. According to some example embodiments, the first, second, third, and fourth photoelectric conversion regions 110a, 110b, 110c, and 110d may be included in the first pixel region PX1 and the second pixel region PX2 each including the first color filter CF1 or green color filter. Therefore, the first and second pixel regions PX1 and PX2 each having higher sensitivity may be used to calculate, e.g. to precisely calculate a phase difference of light in the first direction D1 and a phase difference of light in the second direction D2.

Figure 4B:
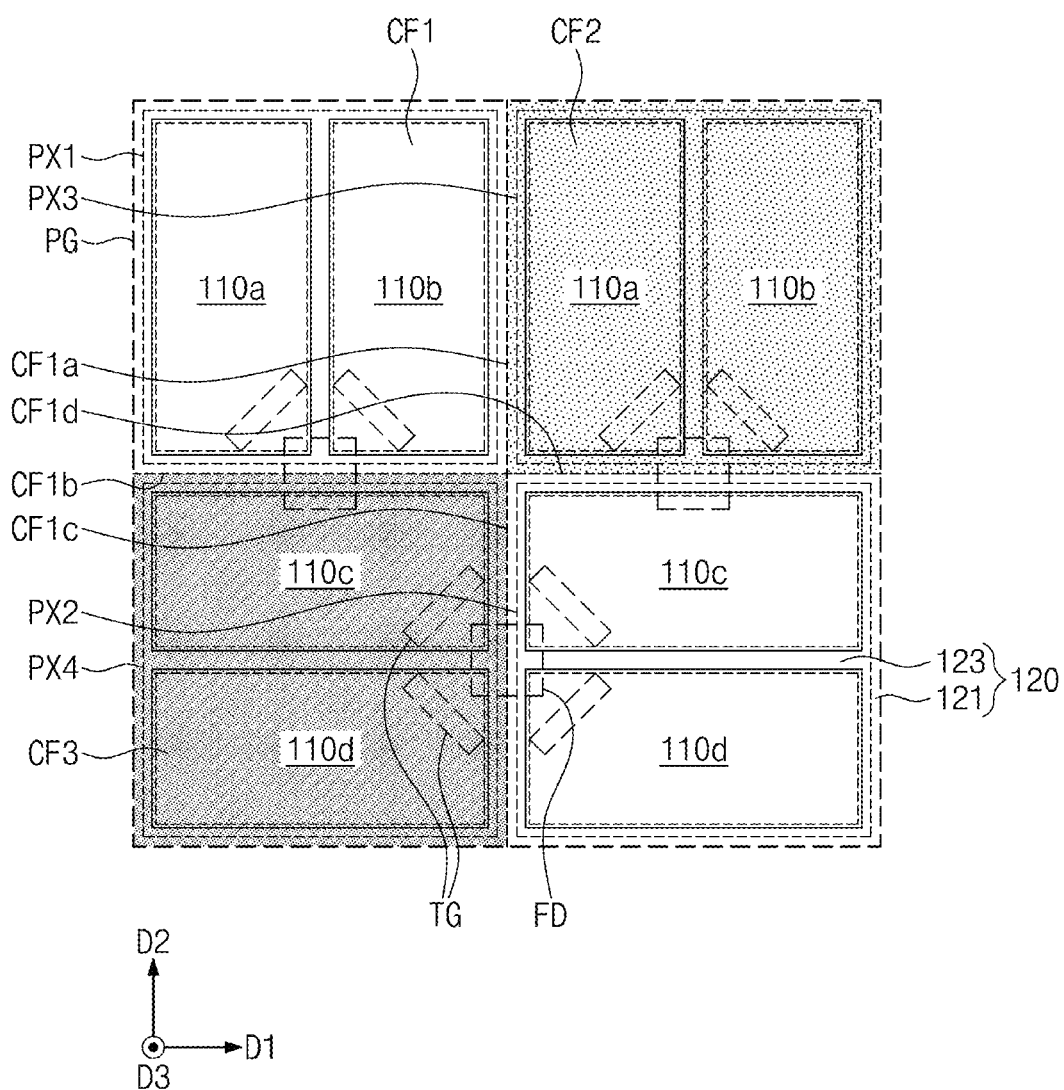
FIG. 4B illustrates a plan view showing one of pixel groups depicted in FIG. 4A.

FIG. 4B illustrates a plan view showing one of pixel groups depicted in FIG. 4A.

Referring to FIG. 4B, a plurality of floating diffusion regions FD may be included in the substrate 100 provided in a single pixel group PG. For example, three floating diffusion regions FD may be disposed in a single pixel group PG. The floating diffusion regions FD may each be an area where second conductivity type impurities are included, e.g. doped and/or incorporated, in the substrate 100. The second conductivity type impurities may have a conductivity type opposite to that of the first conductivity type impurities. The second conductivity type impurities may include n-type impurities, such as one or more of phosphorus (P), arsenic (As), bismuth (Bi), and antimony (Sb), having the same or different dopant concentrations and having the same or different depths.

When viewed in plan, the floating diffusion region FD may be disposed to overlap a corresponding one of a boundary between the first and fourth pixel regions PX1 and PX4, a boundary between the second and third pixel regions PX2 and PX3, a boundary between the third and fourth pixel regions PX3 and PX4. For example, each of the floating diffusion regions FD may be disposed to vertically overlap a point where the first part 121 of the pixel separation structure 120 is connected to the second part 123 of the pixel separation structure 120.

A plurality of transfer gate patterns TG may be provided in a single pixel group PG. The transfer gate patterns TG may include metal, metal silicide, doped or undoped polysilicon, or any combination thereof. When viewed in plan, the transfer gate patterns TG may be adjacent to the floating diffusion regions FD. For example, a pair of transfer gate patterns TG may be adjacent to one floating diffusion region FD. A single pixel region PX may include a pair of transfer gate patterns TG. Each of the pair of transfer gate patterns TG may be disposed symmetrically to each other about the second part 123 of the pixel separation structure 120. For example, a pair of transfer gate patterns TG on the second pixel region PX2 and a pair of transfer gate patterns TG on the fourth pixel region PX4 may be disposed to surround one floating diffusion region FD adjacent to the pairs of transfer gate patterns TG.

FIG. 5A illustrates a plan view of section A depicted in FIG. 1, showing an image sensor according to some example embodiments of inventive concepts. A repetitive description on the same features will be omitted for brevity, and a difference from the mentioned above will be discussed in detail.

Referring to FIG. 5A, an image sensor according to some example embodiments of inventive concepts may include a photoelectric conversion layer 10, a wiring layer 20, and an optical transmittance layer 30. The photoelectric conversion layer 10 may include a substrate 100 and a pixel separation structure 120. The substrate 100, the wiring layer 20, and the optical transmittance layer 30 may be the same or substantially the same as those discussed with reference to FIGS. 2 and 3.

According to some example embodiments, when viewed in plan, the pixel separation structure 120 may be configured such that the second part 123 provided in the first pixel region PX1 may be aligned in the second direction D2, and that the second part 123 provided in the fourth pixel region PX4 may be aligned in the second direction D2. Each of the first and fourth pixel regions PX1 and PX4 may include the first photoelectric conversion region 110a and the second photoelectric conversion region 110b that are spaced apart from each other across the second part 123 of the pixel separation structure 120. The first and second photoelectric conversion regions 110a and 110b may extend parallel to the second part 123 and may have their major axes in the second direction D2.

The pixel separation structure 120 may be configured such that the second part 123 provided in the second pixel region PX2 may be aligned in the first direction D1, and such that the second part 123 provided in the third pixel region PX3 may be aligned in the first direction D1. Each of the second and third pixel regions PX2 and PX3 may include the third photoelectric conversion region 110c and the fourth photoelectric conversion region 110d that are spaced apart from each other across the second part 123 of the pixel separation structure 120. The third and fourth photoelectric conversion regions 110c and 110d may extend parallel to the second part 123 and may have their major axes in the first direction D1.

Figure 5B:
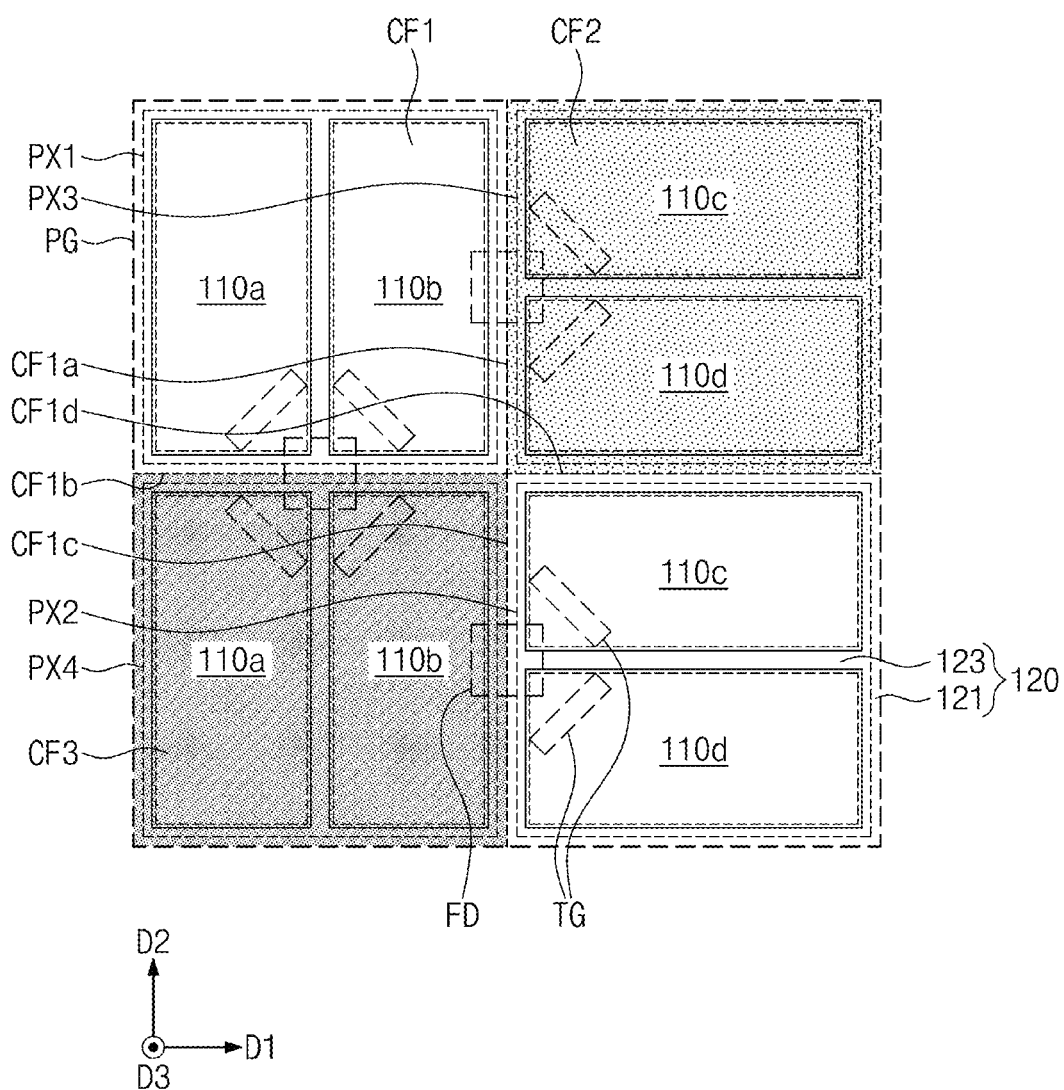
FIG. 5B illustrates a plan view showing one of pixel groups depicted in FIG. 5A.

FIG. 5B illustrates a plan view showing one of pixel groups depicted in FIG. 5A.

Referring to FIG. 5B, a plurality of floating diffusion regions FD may be included in the substrate 100 provided in a single pixel group PG. For example, three floating diffusion regions FD may be disposed in a single pixel group PG. The floating diffusion regions FD may each be an area where second conductivity type impurities are incorporated, e.g. doped in the substrate 100. The second conductivity type impurities may have a conductivity type opposite to that of the first conductivity type impurities. The second conductivity type impurities may include n-type impurities, such as one or more of phosphorus (P), arsenic (As), bismuth (Bi), and antimony (Sb) having the same or different dopant concentrations, and having the same or different depths.

When viewed in plan, the floating diffusion region FD may be disposed to overlap a corresponding one of a boundary between the first and third pixel regions PX1 and PX3, a boundary between the first and fourth pixel regions PX1 and PX4, a boundary between the second and fourth pixel regions PX2 and PX4. For example, each of the floating diffusion regions FD may be disposed to vertically overlap a point where the first part 121 of the pixel separation structure 120 is connected to the second part 123 of the pixel separation structure 120.

A plurality of transfer gate patterns TG may be provided in a single pixel group PG. The transfer gate patterns TG may include metal, metal silicide, doped or undoped polysilicon, or any combination thereof. When viewed in plan, the transfer gate patterns TG may be adjacent to the floating diffusion regions FD. For example, a pair of transfer gate patterns TG may be adjacent to one floating diffusion region FD. A single pixel region PX may include a pair of transfer gate patterns TG. Each of the pair of transfer gate patterns TG may be disposed symmetrically to each other about the second part 123 of the pixel separation structure 120. For example, a pair of transfer gate patterns TG on the first pixel region PX1 and a pair of transfer gate patterns TG on the fourth pixel region PX4 may be disposed to surround one floating diffusion region FD adjacent to the pairs of the transfer gate patterns TG.

Figure 6:
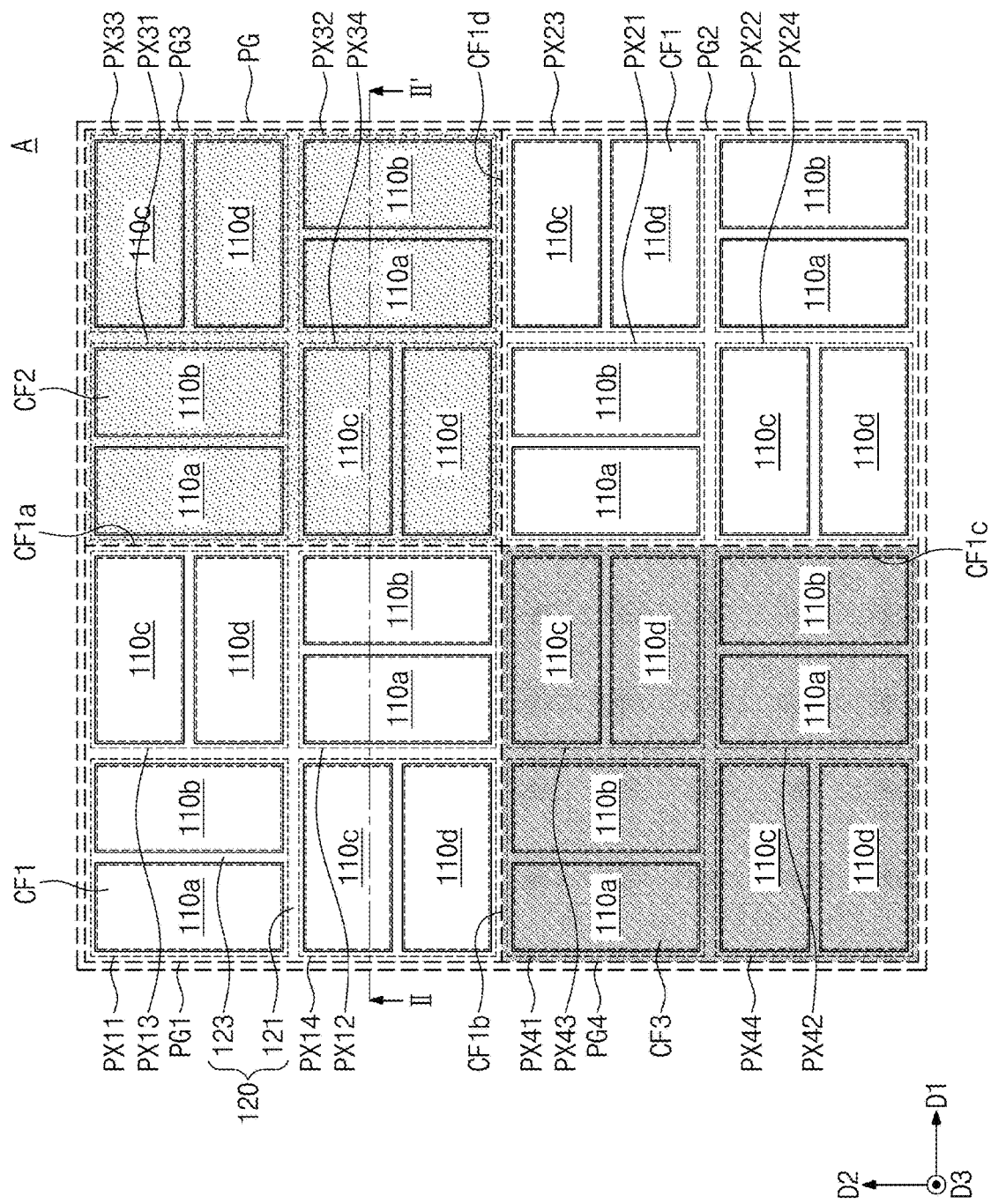
FIG. 6 illustrates a plan view of section A depicted in FIG. 1, showing an image sensor according to some example embodiments of inventive concepts.
Figure 7:
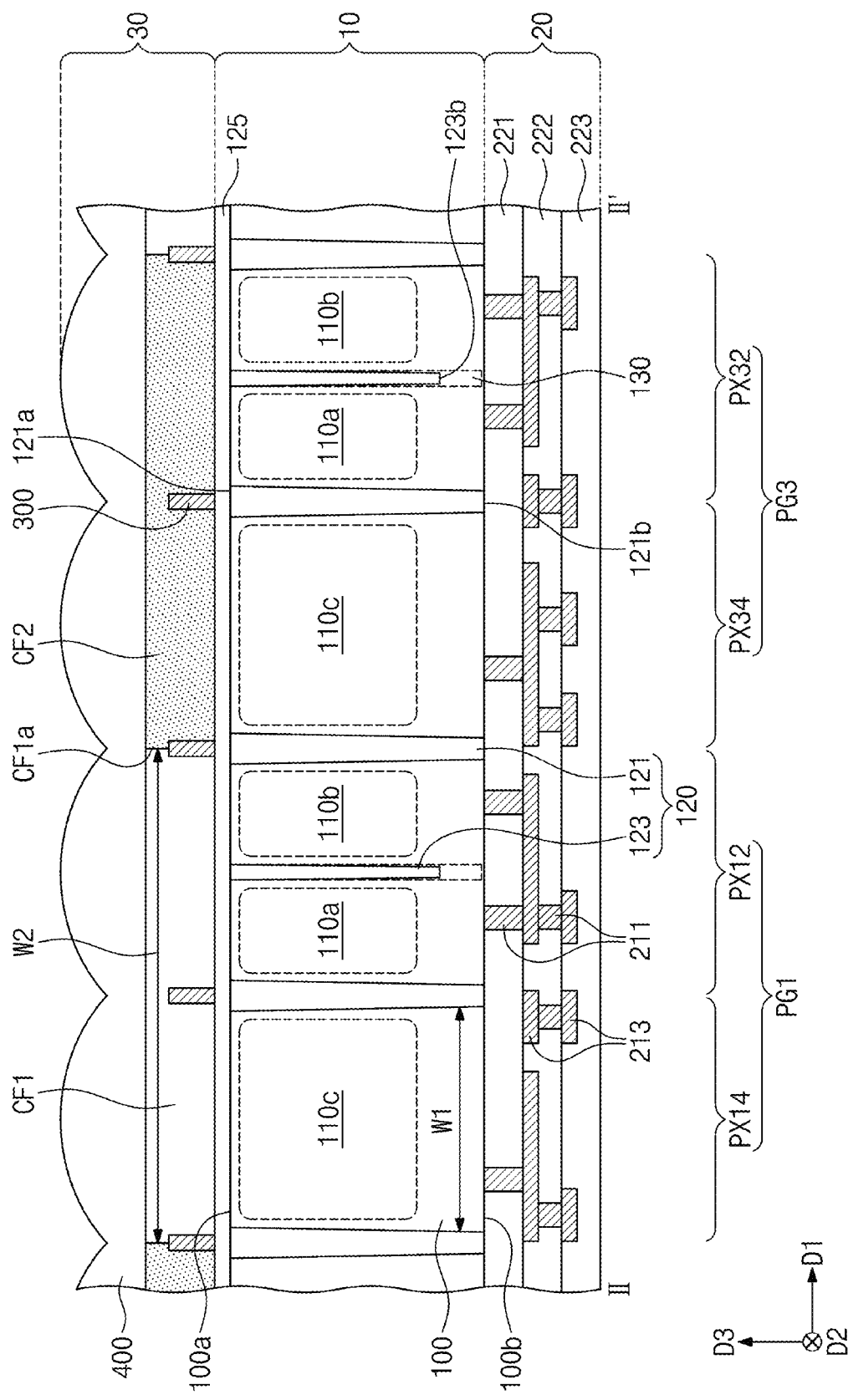
FIG. 7 illustrates a cross-sectional view taken along line II-IF of FIG. 6.

FIG. 6 illustrates a plan view of section A depicted in FIG. 1, showing an image sensor according to some example embodiments of inventive concepts. FIG. 7 illustrates a cross-sectional view taken along line II-IF of FIG. 6. A repetitive description on the same features will be omitted, and a difference from the mentioned above will be discussed in detail.

Referring to FIGS. 6 and 7, an image sensor according to some embodiments of inventive concepts may include a photoelectric conversion layer 10, a wiring layer 20, and an optical transmittance layer 30. The photoelectric conversion layer 10 may include a substrate 100 and a pixel separation structure 120. The optical transmittance layer 30 may include color filters CF1, CF2, and CF3 and micro-lenses 400. The substrate 100, the wiring layer 20, and the micro-lenses 400 may be the same or substantially the same as those discussed with reference to FIGS. 2 and 3.

The substrate 100 may include a plurality of pixel groups PG. Each of the pixel groups PG may be arranged in a repetitive matrix shape along the first direction D1 and the second direction D2 that intersect each other. The pixel groups PG may include first, second, third, and fourth pixel groups PG1, PG2, PG3, and PG4. When viewed in plan view, each of the first, second, third, and fourth pixel groups PG1, PG2, PG3, and PG4 may have a two-by-two arrangement. For example, the first pixel group PG1 and the third pixel group PG3 may be spaced apart from each other in the first direction D1. The first pixel group PG1 and the fourth pixel group PG4 may be spaced apart from each other in the second direction D2. The second pixel group PG2 may be disposed between the third pixel group PG3 and the fourth pixel group PG4. For example, the first pixel group PG1 and the second pixel group PG2 may each be an area where a green color filter is disposed. The third pixel group PG3 may be an area where a red color filter is disposed. The fourth pixel group PG4 may be an area where a blue color filter is disposed.

Each of the first, second, third, and fourth pixel groups PG1, PG2, PG3, and PG4 may include a plurality of pixel regions defined by the pixel separation structure 120. For example, the first pixel group PG1 may include first, second, third, and fourth pixel regions PX11, PX12, PX13, and PX14. The second pixel group PG2 may include first, second, third, and fourth pixel regions PX21, PX22, PX23, and PX24. The third pixel group PG3 may include first, second, third, and fourth pixel regions PX31, PX32, PX33, and PX34. The fourth pixel group PG4 may include first, second, third, and fourth pixel regions PX41, PX42, PX43, and PX44.

For example, the first, second, third, and fourth pixel regions PX11, PX12, PX13, and PX14 of the first pixel group PG1 may be spaced apart from each other across the pixel separation structure 120. When viewed in plan view, the first, second, third, and fourth pixel regions PX11, PX12, PX13, and PX14 may constitute or correspond to a two-by-two arrangement. For example, the first and third pixel regions PX11 and PX13 may be aligned in the first direction D1, and the first and fourth pixel regions PX11 and PX14 may be aligned in the second direction D2. The first and second pixel regions PX11 and PX12 may not be aligned in the first and second directions D1 and D2, e.g. may be diagonally arranged with respect to each other or arranged in cater-corners with respect to each other. The second and third pixel regions PX12 and PX13 may be aligned in the second direction D2, and the second and fourth pixel regions PX12 and PX14 may be aligned in the first direction D1. The first, second, third, and fourth pixel regions of each of the second, third, and fourth pixel groups PG2, PG3, and PG4 may be the same or substantially the same as the first, second, third, and fourth pixel regions PX11, PX12, PX13, and PX14 of the first pixel group PG1.

The color filters CF1, CF2, and CF3 may be provided on the first surface 100a of the substrate 100. The color filters CF1, CF2, and CF3 may be disposed to correspond to the first, second, third, and fourth pixel groups PG1, PG2, PG3, and PG4.

The color filters CF1, CF2, and CF3 may include a pair of first color filters CF1, a second color filter CF2 between the pair of first color filters CF1, and a third color filter CF3 between the pair of first color filters CF1. Each of the color filters CF1, CF2, and CF3 may have a width of about 2 µm, e.g. 2 µm, to about 3 µm, e.g. 3 µm, in the first direction D1, and may have the same or different widths. For example, the pair of first color filters CF1 may be or include green color filters, the second color filter CF2 may be or include a red color filter, and the third color filter CF3 may be or include a blue color filter. A pair of first color filters CF1 may vertically overlap each of the first pixel group PG1 and the second pixel group PG2. The pair of first color filters CF1 may be transparent to a first light and may be diagonally spaced apart from each other.

The second color filter CF2 may be disposed between the pair of first color filters CF1. For example, the second color filter CF2 may be adjacent to one lateral surface CF1a of one of the pair of first color filters CF1 and to one lateral surface CF1d of the other of the pair of first color filters CF1. The second color filter CF2 may vertically overlap the third pixel group PG3. The second color filter CF2 may be transparent to a second light different from the first light.

The third color filter CF3 may be disposed between the pair of first color filters CF1. For example, the third color filter CF3 may be adjacent to another lateral surface CF1b of the one of the pair of first color filters CF1 and to another lateral surface CF1c of the other of the pair of first color filters CF1. The third color filter CF3 may vertically overlap the fourth pixel group PG4. The third color filter CF3 may be transparent to a third light different from both the first light and the second light.

For example, the color filters CF1, CF2, and CF3 may be arranged in a tetra-pattern in which the number of green color filters is greater than twice the number of red color filters or blue color filters. In the tetra-pattern, the color filters CF1, CF2, and CF3 on the pixel regions that are disposed in four-by-four arrangement may constitute or be included in a single color filter group, and the single color filter group may include two green color filters that are disposed diagonally (or cater-corners) and also include a blue color filter and a red color filter that are disposed diagonally (or cater-corners). For example, each of the red and blue color filters may be disposed between neighboring green color filters. The tetra-patterned color filter group may be repeatedly arrayed along the first direction D1 and the second direction D2.

The color filters CF1, CF2, and CF3 may correspondingly cover the first, second, third, and fourth pixel groups PG1, PG2, PG3, and PG4. For example, one of the first color filters CF1 may horizontally extend to cover a top surface of the pixel separation structure 120 and the first, second, third, and fourth pixel regions PX11, PX12, PX13, and PX14 of the first pixel group PG1.

According to some example embodiments, when viewed in plan view, the pixel separation structure 120 may be configured such that the second part 123 provided in the first pixel region PX11 of the first pixel group PG1 may extend in the second direction D2, and that the second part 123 provided in the second pixel region PX12 of the first pixel group PG1 may extend in the second direction D2. Each of the first and second pixel regions PX11 and PX12 may include the first photoelectric conversion region 110a and the second photoelectric conversion region 110b that are spaced apart from each other across the second part 123 of the pixel separation structure 120.

The pixel separation structure 120 may be configured such that the second part 123 provided in the third pixel region PX13 of the first pixel group PG1 may extend in the first direction D1, and that the second part 123 provided in the fourth pixel region PX14 of the first pixel group PG1 may extend in the first direction D1. Each of the third and fourth pixel regions PX13 and PX14 may include the third photoelectric conversion region 110c and the fourth photoelectric conversion region 110d that are disposed spaced apart from each other across the second part 123 of the pixel separation structure 120.

A planar arrangement of the second parts 123 provided in the second, third, and fourth pixel groups PG1, PG2, and PG3 may be the same as that of the second parts 123 provided in the first pixel group PG1.

Figure 8:
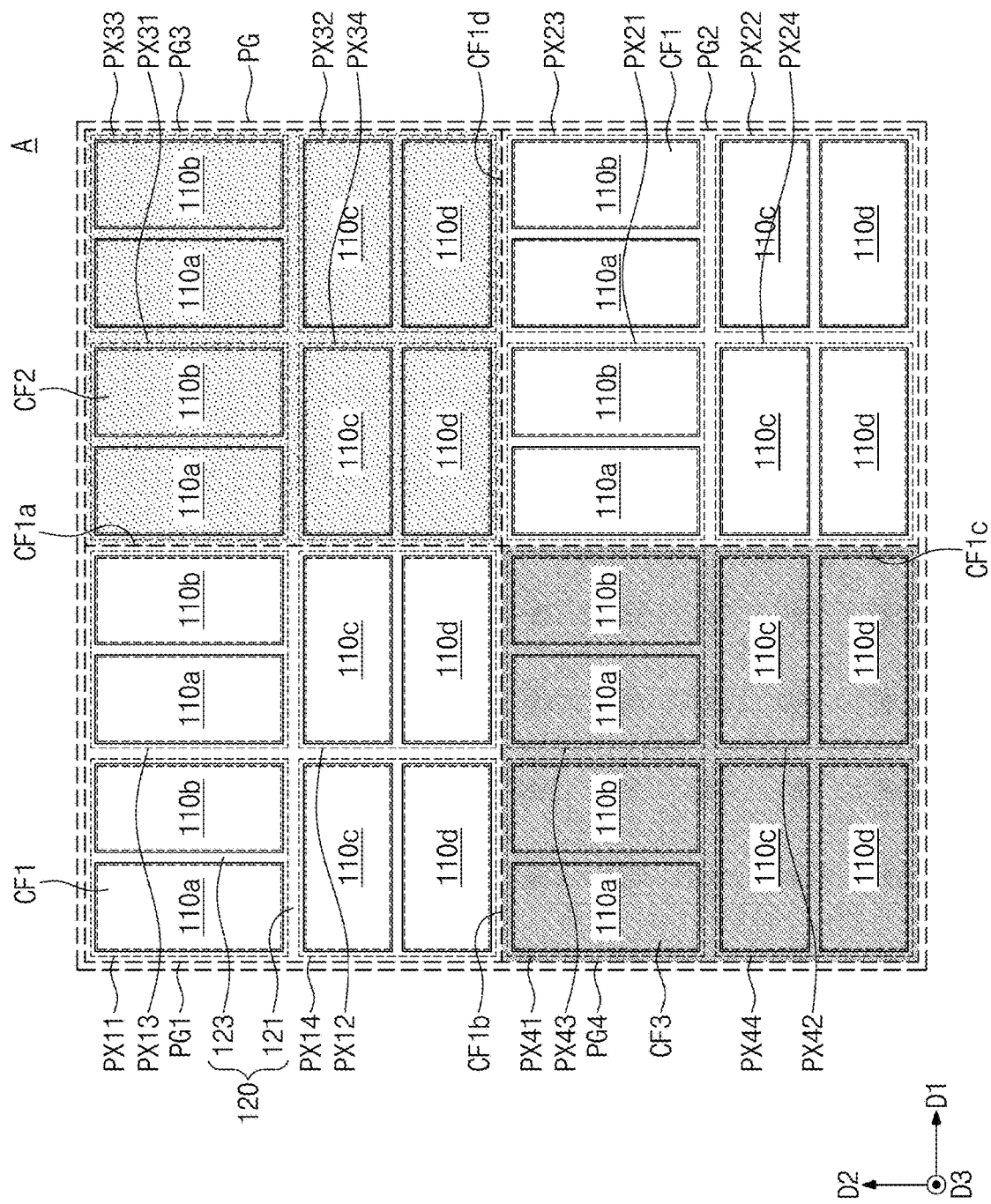
FIGS. 8 and 9 illustrate plan views of section A depicted in FIG. 1, showing an image sensor according to some example embodiments of inventive concepts.

FIG. 8 illustrates a plan view of section A depicted in FIG. 1, showing an image sensor according to some example embodiments of inventive concepts. A repetitive description on the same features will be omitted for brevity, and a difference from the mentioned above will be discussed in detail.

Referring to FIG. 8, an image sensor according to some example embodiments of inventive concepts may include a photoelectric conversion layer 10, a wiring layer 20, and an optical transmittance layer 30. The photoelectric conversion layer 10 may include a substrate 100 and a pixel separation structure 120. The optical transmittance layer 30 may include color filters CF1, CF2, and CF3 and micro-lenses 400. The substrate 100, the wiring layer 20, and the micro-lenses 400 may be substantially the same as those discussed with reference to FIGS. 2 and 3, and the color filters CF1, CF2, and CF3 may be the same or substantially the same as those discussed with reference to FIG. 6.

According to some example embodiments, when viewed in plan view, the pixel separation structure 120 may be configured such that the second part 123 provided in the first pixel region PX11 of the first pixel group PG1 may extend in the second direction D2, and that the second part 123 provided in the third pixel region PX13 of the first pixel group PG1 may extend in the second direction D2. Each of the first and third pixel regions PX11 and PX13 may include the first photoelectric conversion region 110a and the second photoelectric conversion region 110b that are spaced apart from each other across the second part 123 of the pixel separation structure 120.

The pixel separation structure 120 may be configured such that the second part 123 provided in the second pixel region PX12 of the first pixel group PG1 may extend in the first direction D1, and that the second part 123 provided in the fourth pixel region PX14 of the first pixel group PG1 may be extend in the first direction D1. The pixel separation structure 120 may be configured such that the second part 123 provided in the second pixel region PX12 may be aligned in the first direction D1, and that the second part 123 provided in the fourth pixel region PX14 may be aligned in the first direction D1. Each of the second and fourth pixel regions PX12 and PX14 may include the third photoelectric conversion region 110c and the fourth photoelectric conversion region 110d that are disposed spaced apart from each other across the second part 123 of the pixel separation structure 120.

A planar arrangement of the second parts 123 provided in the second, third, and fourth pixel groups PG1, PG2, and PG3 may be the same as that of the second parts 123 provided in the first pixel group PG1. Thus, the second parts 123 disposed in the second and fourth pixel regions PX12 and PX14 of the first pixel group PG1 may be aligned in the first direction D1 with the second parts 123 disposed in the second and fourth pixel regions PX32 and PX34 of the third pixel group PG3. The second parts 123 disposed in the second and fourth pixel regions PX22 and PX24 of the second pixel group PG2 may be aligned in the first direction D1 with the second parts 123 disposed in the second and fourth pixel regions PX42 and PX44 of the fourth pixel group PG4.

Figure 9:
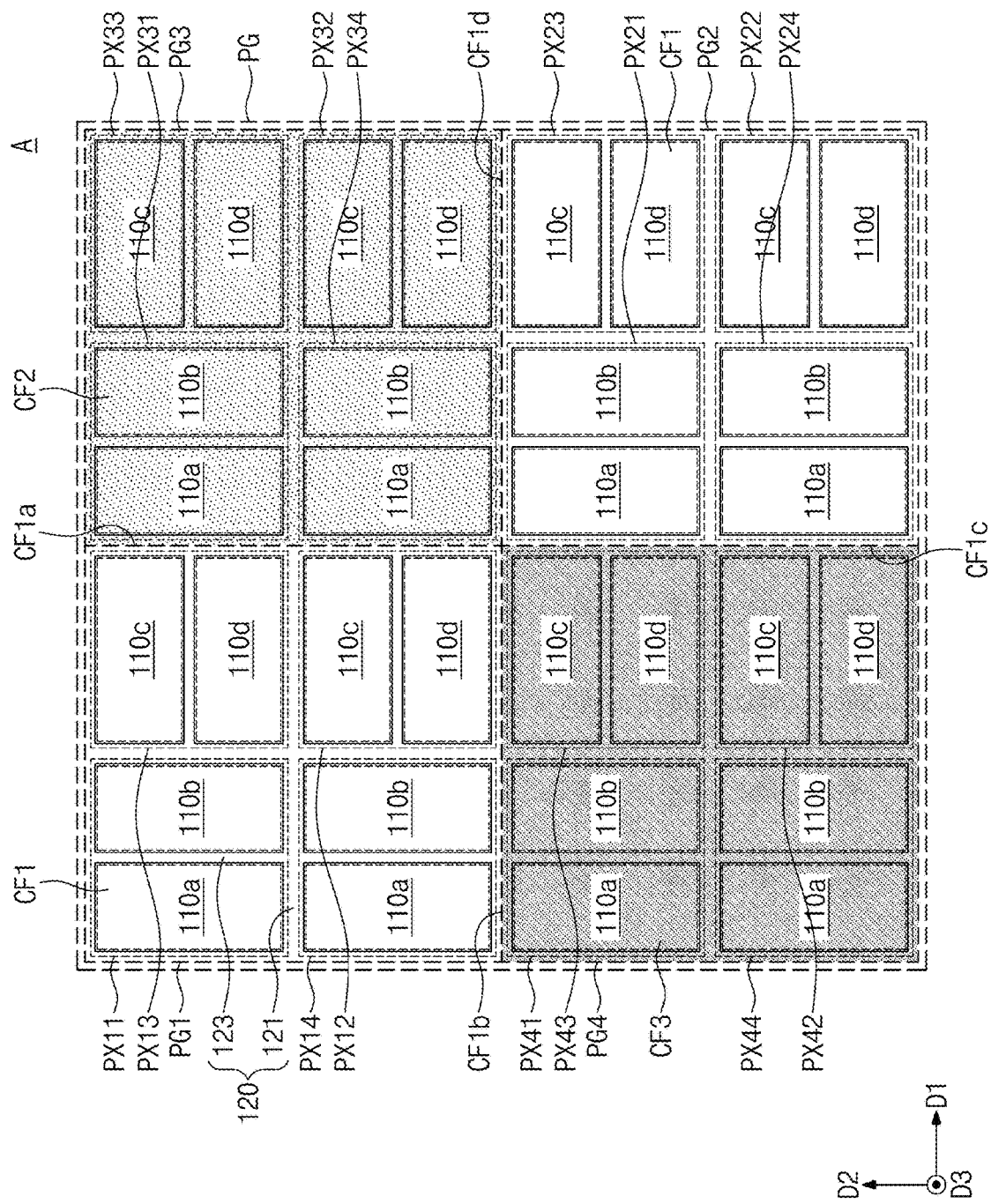

FIG. 9 illustrates a plan view of section A depicted in FIG. 1, showing an image sensor according to some example embodiments of inventive concepts. A repetitive description on the same features will be omitted for brevity, and a difference from the mentioned above will be discussed in detail.

Referring to FIG. 9, an image sensor according to some example embodiments of inventive concepts may include a photoelectric conversion layer 10, a wiring layer 20, and an optical transmittance layer 30. The photoelectric conversion layer 10 may include a substrate 100 and a pixel separation structure 120. The optical transmittance layer 30 may include color filters CF1, CF2, and CF3 and micro-lenses 400. The substrate 100, the wiring layer 20, and the micro-lenses 400 may be substantially the same as those discussed with reference to FIGS. 2 and 3, and the color filters CF1, CF2, and CF3 may be the same or substantially the same as those discussed with reference to FIG. 6.

According to some example embodiments, when viewed in plan view, the pixel separation structure 120 may be configured such that the second part 123 provided in the first pixel region PX11 of the first pixel group PG1 may extend in the second direction D2, and that the second part 123 provided in the fourth pixel region PX14 of the first pixel group PG1 may extend in the second direction D2. The pixel separation structure 120 may be configured such that the second part 123 provided in the first pixel region PX11 may be aligned in the second direction D2, and that the second part 123 provided in the fourth pixel region PX14 may be aligned in the second direction D2. Each of the first and fourth pixel regions PX11 and PX14 may include the first photoelectric conversion region 110a and the second photoelectric conversion region 110b that are spaced apart from each other across the second part 123 of the pixel separation structure 120.

The pixel separation structure 120 may be configured such that the second part 123 provided in the second pixel region PX12 of the first pixel group PG1 may extend in the first direction D1, and that the second part 123 provided in the third pixel region PX13 of the first pixel group PG1 may extend in the first direction D1. Each of the second and third pixel regions PX12 and PX13 may include the third photoelectric conversion region 110c and the fourth photoelectric conversion region 110d that are disposed spaced apart from each other across the second part 123 of the pixel separation structure 120.

A planar arrangement of the second parts 123 provided in the second, third, and fourth pixel groups PG1, PG2, and PG3 may be the same as that of the second parts 123 provided in the first pixel group PG1. Thus, the second parts 123 disposed in the first and fourth pixel regions PX11 and PX14 of the first pixel group PG1 may be aligned in the second direction D2 with the second parts 123 disposed in the first and fourth pixel regions PX41 and PX44 of the fourth pixel group PG4. The second parts 123 disposed in the first and fourth pixel regions PX21 and PX24 of the second pixel group PG2 may be aligned in the second direction D2 with the second parts 123 disposed in the first and fourth pixel regions PX31 and PX34 of the third pixel group PG3.

Figure 10:
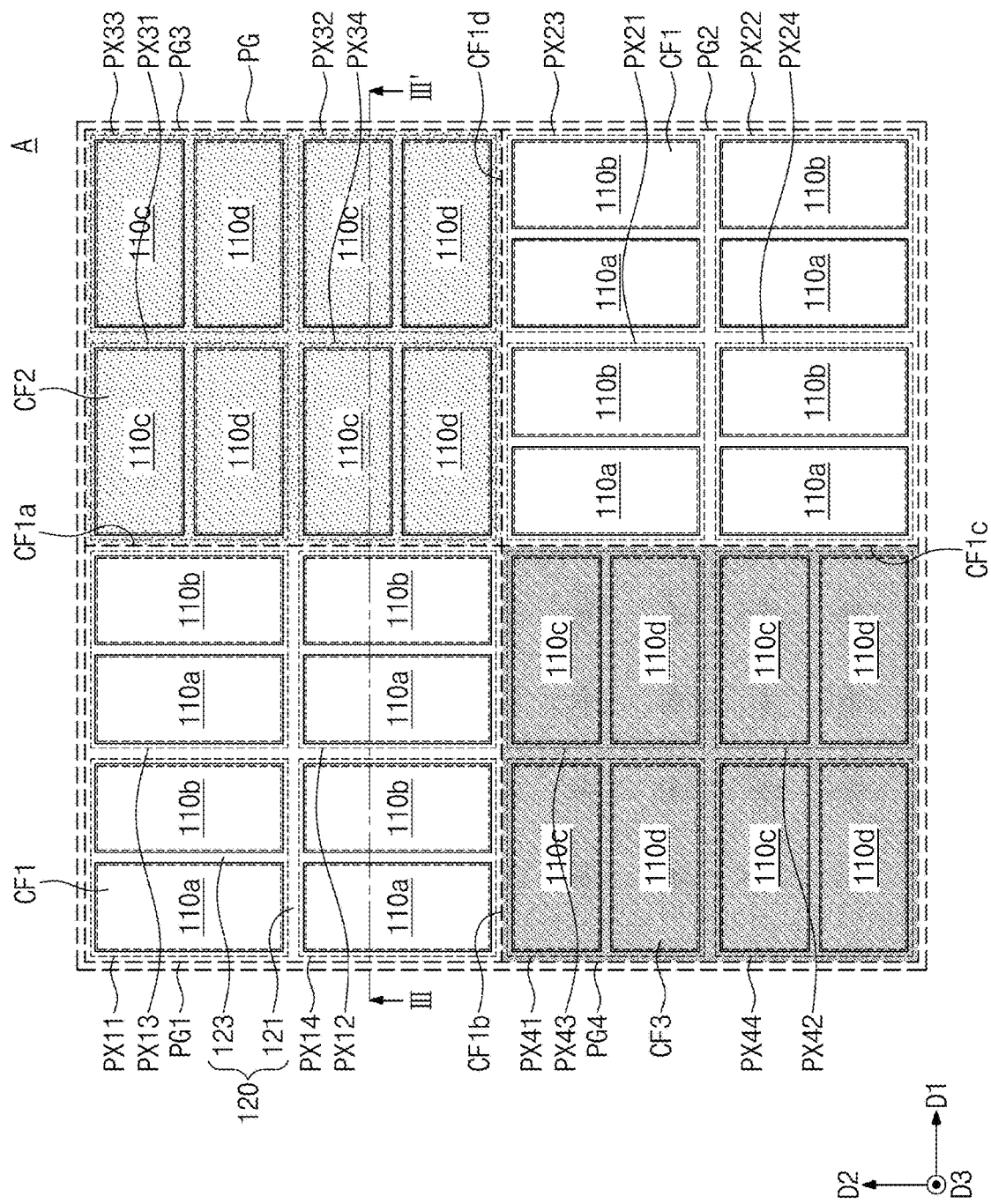
FIG. 10 illustrates a plan view of section A depicted in FIG. 1, showing an image sensor according to some example embodiments of inventive concepts.
Figure 11:
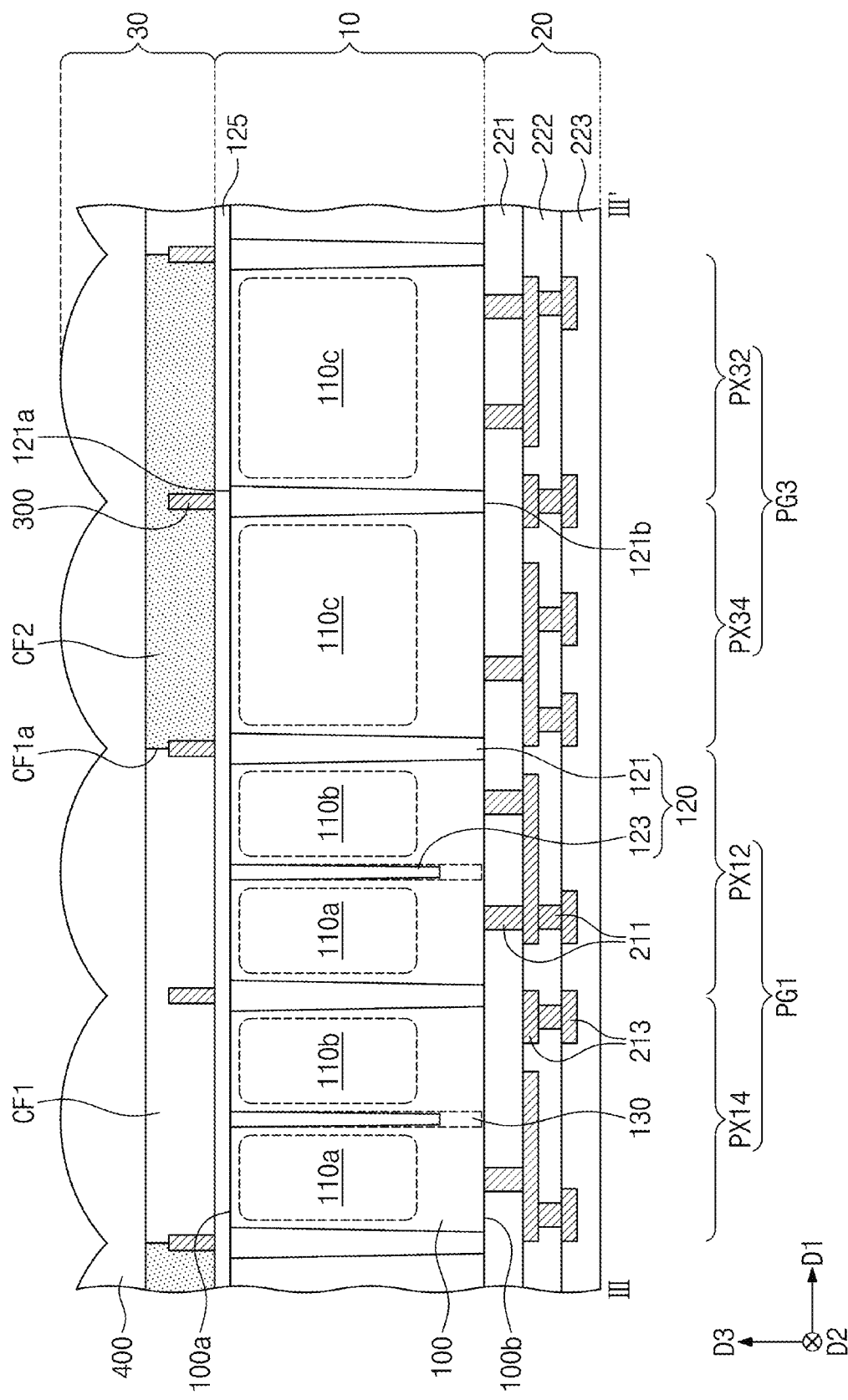
FIG. 11 illustrates a cross-sectional view taken along line III-III' of FIG. 10.

FIG. 10 illustrates a plan view of section A depicted in FIG. 1, showing an image sensor according to some example embodiments of inventive concepts. FIG. 11 illustrates a cross-sectional view taken along line III-III' of FIG. 10. A repetitive description on the same features will be omitted for brevity, and a difference from the mentioned above will be discussed in detail.

Referring to FIGS. 10 and 11, an image sensor according to some embodiments of inventive concepts may include a photoelectric conversion layer 10, a wiring layer 20, and an optical transmittance layer 30. The photoelectric conversion layer 10 may include a substrate 100 and a pixel separation structure 120. The optical transmittance layer 30 may include color filters CF1, CF2, and CF3 and micro-lenses 400. The substrate 100, the wiring layer 20, and the micro-lenses 400 may be the same or substantially the same as those discussed with reference to FIGS. 2 and 3. The color filters CF1, CF2, and CF3 may be the same or substantially the same as those discussed with reference to FIG. 6.

According to some example embodiments, the pixel separation structure 120 may be configured such that the second parts 123 disposed in the first, second, third, and fourth pixel regions PX11, PX12, PX13, and PX14 of the first pixel group PG1 may extend parallel to the first direction D1. The pixel separation structure 120 may be configured such that the second parts 123 disposed in the first, second, third, and fourth pixel regions PX21, PX22, PX23, and PX24 of the second pixel group PG2 may extend parallel to the second direction D2. Each of the first, second, third, and fourth pixel regions PX11, PX12, PX13, and PX14 of the first pixel group PG1 may include the first photoelectric conversion region 110a and the second photoelectric conversion region 110b that are spaced apart from each other across the second part 123 of the pixel separation structure 120. Each of the first, second, third, and fourth pixel regions PX21, PX22, PX23, and PX24 of the second pixel group PG2 may include the first photoelectric conversion region 110a and the second photoelectric conversion region 110b that are spaced apart from each other across the second part 123 of the pixel separation structure 120.

The pixel separation structure 120 may be configured such that the second parts 123 disposed in the first, second, third, and fourth pixel regions PX31, PX32, PX33, and PX34 of the third pixel group PG3 may extend parallel to the first direction D1. The pixel separation structure 120 may be configured such that the second parts 123 disposed in the first, second, third, and fourth pixel regions PX41, PX42, PX43, and PX44 of the fourth pixel group PG4 may extend parallel to the first direction D1. The pixel separation structure 120 may be configured such that the second parts 123 disposed in the first, second, third, and fourth pixel regions PX31, PX32, PX33, and PX34 of the third pixel group PG3 may extend parallel to the first direction D1. Each of the first, second, third, and fourth pixel regions PX31, PX32, PX33, and PX34 of the third pixel group PG3 may include the third photoelectric conversion region 110c and the fourth photoelectric conversion region 110d that are disposed spaced apart from each other across the second part 123 of the pixel separation structure 120. Each of the first, second, third, and fourth pixel regions PX41, PX42, PX43, and PX44 of the fourth pixel group PG4 may include the third photoelectric conversion region 110c and the fourth photoelectric conversion region 110d that are disposed spaced apart from each other across the second part 123 of the pixel separation structure 120.

Figure 12:
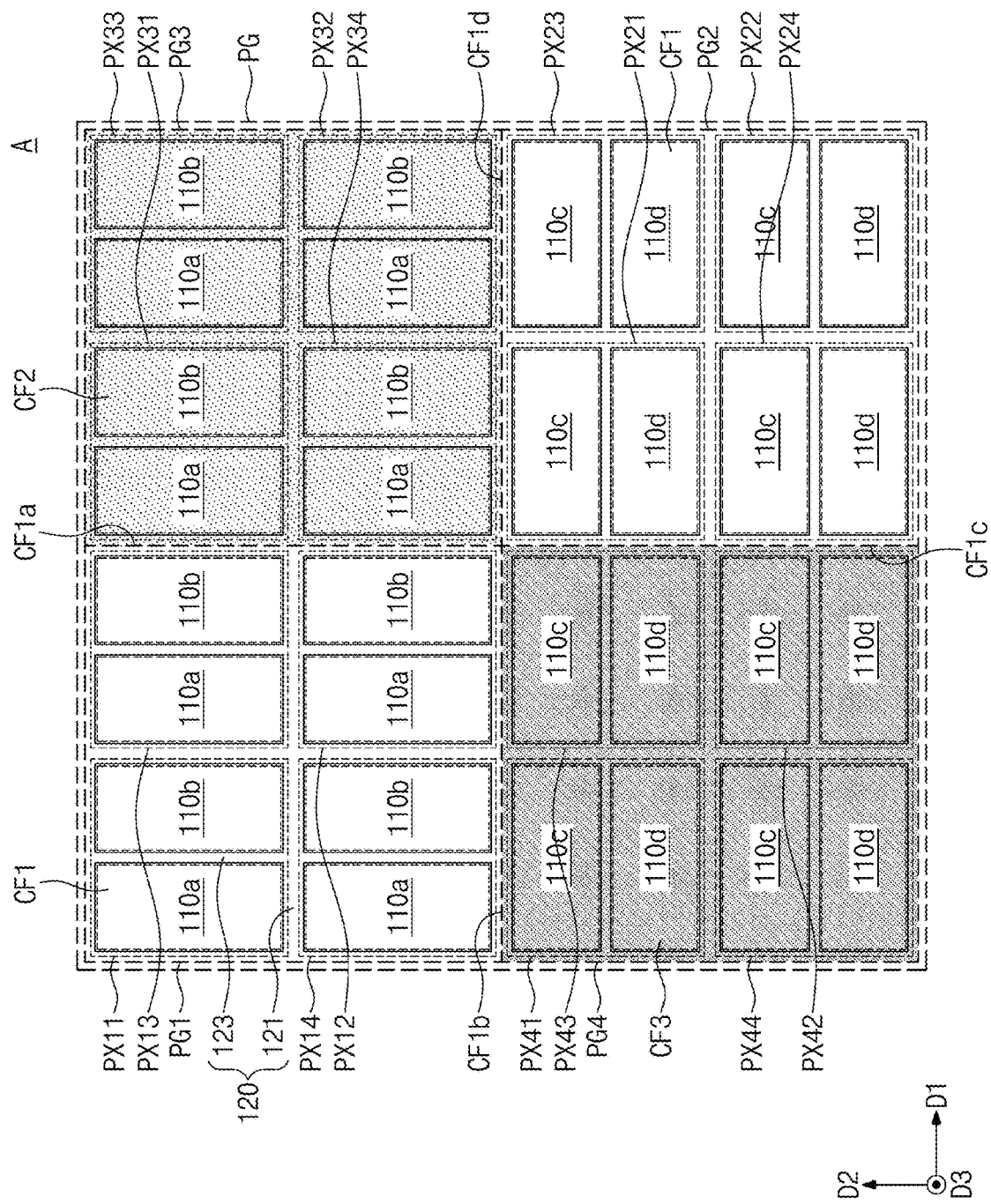
FIGS. 12 and 13 illustrate plan views of section A depicted in FIG. 1, showing an image sensor according to some example embodiments of inventive concepts.

FIG. 12 illustrates a plan view of section A depicted in FIG. 1, showing an image sensor according to some example embodiments of inventive concepts. A repetitive description on the same features will be omitted for brevity, and a difference from the mentioned above will be discussed in detail.

Referring to FIG. 12, an image sensor according to some example embodiments of inventive concepts may include a photoelectric conversion layer 10, a wiring layer 20, and an optical transmittance layer 30. The photoelectric conversion layer 10 may include a substrate 100 and a pixel separation structure 120. The optical transmittance layer 30 may include color filters CF1, CF2, and CF3 and micro-lenses 400. The substrate 100, the wiring layer 20, and the micro-lenses 400 may be substantially the same as those discussed with reference to FIGS. 2 and 3. The color filters CF1, CF2, and CF3 may be substantially the same as those discussed with reference to FIG. 6.

According to some example embodiments, the pixel separation structure 120 may be configured such that the second parts 123 disposed in the first, second, third, and fourth pixel regions PX11, PX12, PX13, and PX14 of the first pixel group PG1 may extend parallel to the second direction D2. The pixel separation structure 120 may be configured such that the second parts 123 disposed in the first, second, third, and fourth pixel regions PX31, PX32, PX33, and PX34 of the third pixel group PG3 may extend parallel to the second direction D2. Each of the first, second, third, and fourth pixel regions PX11, PX12, PX13, and PX14 of the first pixel group PG1 may include the first photoelectric conversion region 110a and the second photoelectric conversion region 110b that are spaced apart from each other across the second part 123 of the pixel separation structure 120. Each of the first, second, third, and fourth pixel regions PX31, PX32, PX33, and PX34 of the third pixel group PG3 may include the first photoelectric conversion region 110a and the second photoelectric conversion region 110b that are spaced apart from each other across the second part 123 of the pixel separation structure 120.

The pixel separation structure 120 may be configured such that the second parts 123 disposed in the first, second, third, and fourth pixel regions PX21, PX22, PX23, and PX24 of the second pixel group PG2 may extend parallel to the first direction D1. The pixel separation structure 120 may be configured such that the second parts 123 disposed in the first, second, third, and fourth pixel regions PX41, PX42, PX43, and PX44 of the fourth pixel group PG4 may extend parallel to the first direction D1. Each of the first, second, third, and fourth pixel regions PX21, PX22, PX23, and PX24 of the second pixel group PG2 may include the third photoelectric conversion region 110c and the fourth photoelectric conversion region 110d that are spaced apart from each other across the second part 123 of the pixel separation structure 120. Each of the first, second, third, and fourth pixel regions PX41, PX42, PX43, and PX44 of the fourth pixel group PG4 may include the third photoelectric conversion region 110c and the fourth photoelectric conversion region 110d that are disposed spaced apart from each other across the second part 123 of the pixel separation structure 120.

The second parts 123 disposed in the first and third pixel regions PX31 and PX33 of the third pixel group PG3 may be aligned in the first direction D1 with the second parts 123 disposed in the first and third pixel regions PX21 and PX23 of the second pixel group PG2. The second parts 123 disposed in the second and fourth pixel regions PX32 and PX34 of the third pixel group PG3 may be aligned in the first direction D1 with the second parts 123 disposed in the second and fourth pixel regions PX22 and PX24 of the second pixel group PG2.

Figure 13:
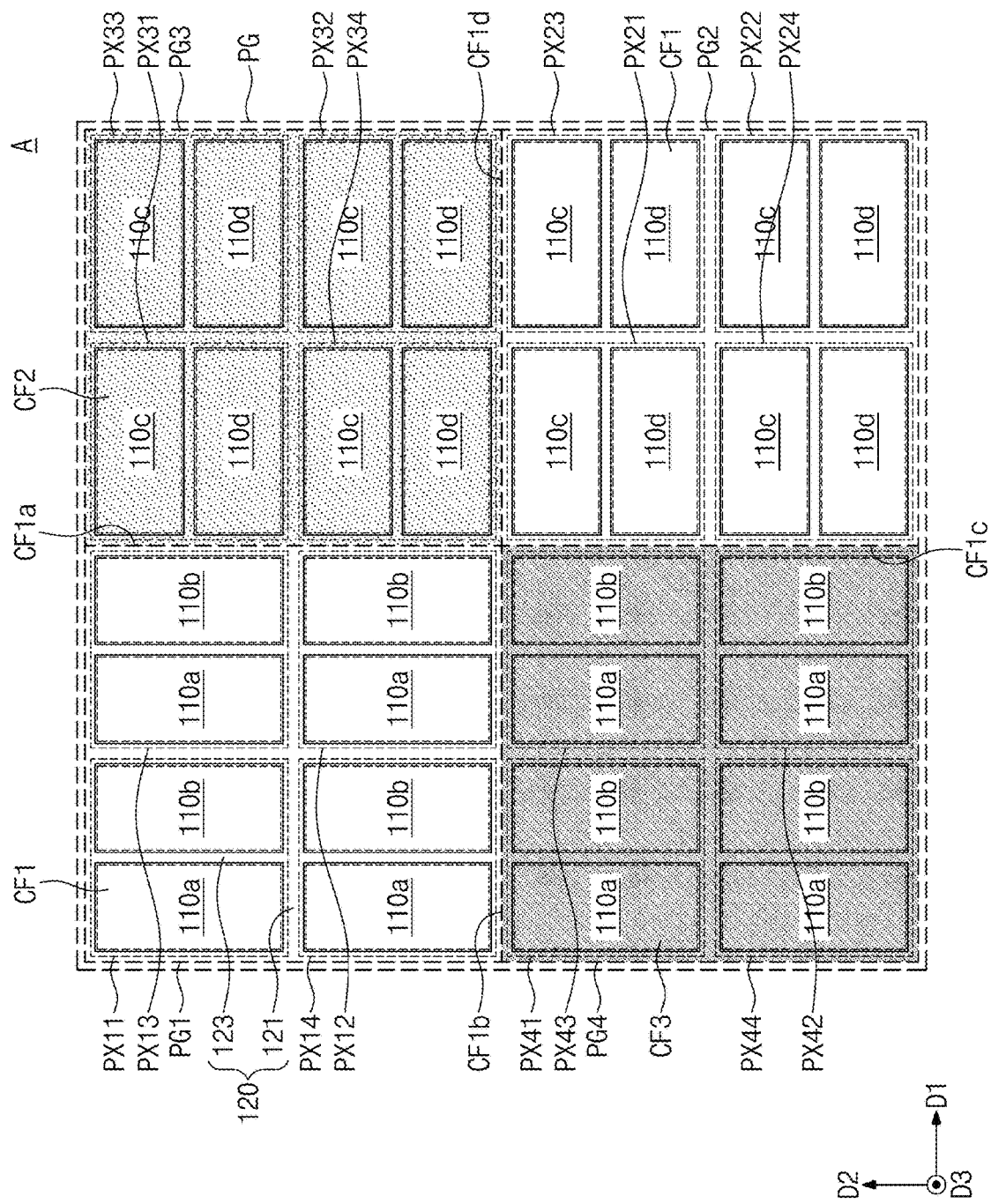

FIG. 13 illustrates a plan view of section A depicted in FIG. 1, showing an image sensor according to some example embodiments of inventive concepts. A repetitive description on the same features will be omitted for brevity, and a difference from the mentioned above will be discussed in detail.

Referring to FIG. 13, an image sensor according to some example embodiments of inventive concepts may include a photoelectric conversion layer 10, a wiring layer 20, and an optical transmittance layer 30. The photoelectric conversion layer 10 may include a substrate 100 and a pixel separation structure 120. The optical transmittance layer 30 may include color filters CF1, CF2, and CF3 and micro-lenses 400. The substrate 100, the wiring layer 20, and the micro-lenses 400 may be substantially the same as those discussed with reference to FIGS. 2 and 3. The color filters CF1, CF2, and CF3 may be the same or substantially the same as those discussed with reference to FIG. 6.

According to some example embodiments, the pixel separation structure 120 may be configured such that the second parts 123 disposed in the first, second, third, and fourth pixel regions PX11, PX12, PX13, and PX14 of the first pixel group PG1 may extend parallel to the second direction D2. The pixel separation structure 120 may be configured such that the second parts 123 disposed in the first, second, third, and fourth pixel regions PX41, PX42, PX43, and PX44 of the fourth pixel group PG4 may extend parallel to the second direction D2. Each of the first, second, third, and fourth pixel regions PX11, PX12, PX13, and PX14 of the first pixel group PG1 may include the first photoelectric conversion region 110a and the second photoelectric conversion region 110b that are spaced apart from each other across the second part 123 of the pixel separation structure 120. Each of the first, second, third, and fourth pixel regions PX41, PX42, PX43, and PX44 of the fourth pixel group PG4 may include the first photoelectric conversion region 110a and the second photoelectric conversion region 110b that are spaced apart from each other across the second part 123 of the pixel separation structure 120.

The second parts 123 disposed in the first and fourth pixel regions PX11 and PX14 of the first pixel group PG1 may be aligned in the second direction D2 with the second parts 123 disposed in the first and fourth pixel regions PX41 and PX44 of the fourth pixel group PG4. The second parts 123 disposed in the second and third pixel regions PX12 and PX13 of the first pixel group PG1 may be aligned in the second direction D2 with the second parts 123 disposed in the second and third pixel regions PX42 and PX43 of the fourth pixel group PG4.

The pixel separation structure 120 may be configured such that the second parts 123 disposed in the first, second, third, and fourth pixel regions PX21, PX22, PX23, and PX24 of the second pixel group PG2 may extend parallel to the first direction D1. The pixel separation structure 120 may be configured such that the second parts 123 disposed in the first, second, third, and fourth pixel regions PX31, PX32, PX33, and PX34 of the third pixel group PG3 may extend parallel to the first direction D1. Each of the first, second, third, and fourth pixel regions PX21, PX22, PX23, and PX24 of the second pixel group PG2 may include the third photoelectric conversion region 110c and the fourth photoelectric conversion region 110d that are spaced apart from each other across the second part 123 of the pixel separation structure 120. Each of the first, second, third, and fourth pixel regions PX41, PX42, PX43, and PX44 of the fourth pixel group PG4 may include the third photoelectric conversion region 110c and the fourth photoelectric conversion region 110d that are disposed spaced apart from each other across the second part 123 of the pixel separation structure 120.

An image sensor according to inventive concepts may include pixel regions to detect a phase difference of light that is incident differently left and right and may include pixel region to detect a phase difference of light that is incident differently up and down. Accordingly, the phase difference of light may be more precisely detected to provide the image sensor with an improved auto-focus operation.

Example embodiments are not limited to those described above. Furthermore each of the example embodiments are not necessarily mutually exclusive to one another. For example, an image sensor may have some features disclosed with reference to one figure, and some other features disclosed with reference to another figure.

Although some example embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed is:
1. An image sensor comprising:
 a substrate including a plurality of pixel groups, each of the plurality of pixel groups including a plurality of pixel regions;

a plurality of color filters two-dimensionally arranged on a first surface of the substrate; and
a pixel separation structure in the substrate,
wherein the pixel separation structure includes,
   a first part defining each of the plurality of pixel regions, and
   a second part connected to the first part and running across an inside of each of the plurality of pixel regions,
wherein the plurality of color filters include,
   a pair of first color filters transparent to a first light, one of the pair of first color filters spaced apart from the other one of the pair of first color filters,
   a second color filter transparent to a second light and contacting one lateral surface of the one of the pair of first color filters and one lateral surface of the other one of the pair of first color filters, and
   a third color filter transparent to a third light and contacting another lateral surface of the one of the pair of first color filters and another lateral surface of the other of the pair of first color filters, and
wherein each of the pixel groups includes a first pixel region, a second pixel region, a third pixel region adjacent to the first pixel region and the second pixel region, and a fourth pixel region adjacent to the first pixel region and the second pixel region,
the second part of the pixel separation structure in each of the first and second pixel regions extends in a first direction parallel to the first surface of the substrate, and
the second part of the pixel separation structure in each of the third and fourth pixel regions extend in a second direction intersecting the first direction.

2. The image sensor of claim 1, wherein
the pair of first color filters overlap the first and second pixel regions,
the second color filter overlaps the third pixel region, and
the third color filter overlaps the fourth pixel region.

3. The image sensor of claim 1, wherein
the one of the pair of first color filters overlaps the first pixel region, and the second color filter overlaps second pixel region, and
the other of the pair of first color filters overlaps the third pixel region and the third color filter overlaps the fourth pixel region.

4. The image sensor of claim 1, wherein
the one of the pair of first color filters overlaps the first pixel region and the third color filter overlaps the second pixel region, and
the other of the pair of first color filters overlaps the third pixel region and the second color filter overlaps the fourth pixel region, respectively.

5. The image sensor of claim 1, wherein the first part of the pixel separation structure penetrates the substrate.

6. The image sensor of claim 1, wherein
the second part of the pixel separation structure extends vertically from the first surface of the substrate toward a second surface of the substrate, the second surface opposite the first surface, and
a bottom surface of the second part of the pixel separation structure is at a different level from the second surface of the substrate.

7. The image sensor of claim 1, wherein each of the first to fourth pixel regions includes a first photoelectric conversion region and a second photoelectric conversion region spaced apart from the first photoelectric conversion region and divided by the second part of the pixel separation structure.

8. The image sensor of claim 7, further comprising:
a plurality of micro-lenses on the plurality of color filters,
wherein each of the plurality of micro-lenses vertically overlaps the first and second photoelectric conversion regions.

9. The image sensor of claim 1, wherein each of the first to fourth pixel regions has a width in the first direction, the width ranging from about 1 µm to about 1.4 µm.

10. An image sensor, comprising:
a substrate including a first pixel group, a second pixel group, a third pixel group, and a fourth pixel group, each of the first to fourth pixel groups including a first pixel region, a second pixel region, a third pixel region adjacent to the first pixel region and the second pixel region, and a fourth pixel region adjacent to the first pixel region and the second pixel region;
a plurality of color filters two-dimensionally arranged on a first surface of the substrate; and
a pixel separation structure in the substrate,
wherein the pixel separation structure includes,
   a first part defining each of the first to fourth pixel regions, and
   a second part connected to the first part and across an inside of each of the first to fourth pixel regions,
wherein the plurality of color filters include,
   a pair of first color filters transparent to a first light, one of the pair of first color filters spaced apart from the other one of the pair of first color filters,
   a second color filter transparent to a second light and contacting one lateral surface of the one of the pair of first color filters and with one lateral surface of the other one of the pair of first color filters, and
   a third color filter transparent to a third light and contacting another lateral surface of the one of the pair of first color filters and with another lateral surface of the other one of the pair of first color filters,
wherein each of the plurality of color filters extends horizontally and covers a corresponding one of the first to fourth pixel regions,
the second part of the pixel separation structure in each of the first and second pixel regions extends in a first direction parallel to the first surface of the substrate, and
the second part of the pixel separation structure in each of the third and fourth pixel regions extends in a second direction intersecting the first direction.

11. The image sensor of claim 10, wherein
the pair of first color filters overlap each of the first and second pixel regions, and
the second color filter overlaps the third pixel region and the third color filter overlaps the fourth pixel region.

12. The image sensor of claim 10, wherein
the first and third pixel regions are aligned in the first direction, and
the first and fourth pixel regions are aligned in the second direction.

13. The image sensor of claim 10, wherein
the one of the pair of first color filters overlaps the first pixel group,
the second color filter overlaps the third pixel group and is spaced apart in the first direction from the first pixel group, and the first and second pixel regions of the first pixel group are aligned in one of the first and second directions and the first and second pixel regions of the second pixel group are aligned in the one of the first and second directions.

14. The image sensor of claim 10, wherein a height of the first part is greater than a height of the second part.

15. The image sensor of claim 10, wherein the substrate further includes a dummy impurity region between the first surface of the substrate and a bottom surface of the second part of the pixel separation structure.

16. An image sensor, comprising:
a substrate including a first pixel group, a second pixel group, a third pixel group, and a fourth pixel group, each of the first to fourth pixel groups including a first pixel region, a second pixel region, a third pixel region adjacent to the first pixel region and the second pixel region, and a fourth pixel region adjacent to the first pixel region and the second pixel region;
a plurality of color filters two-dimensionally arranged on a first surface of the substrate; and
a pixel separation structure in the substrate,
wherein the pixel separation structure includes
a first part defining each of the first to fourth pixel regions, and
a second part connected to the first part and running across an inside of each of the first to fourth pixel regions,
wherein the plurality of color filters include,
a pair of first color filters transparent to a first light, one of the pair of first color filters spaced apart from the other one of the pair of first color filters,
a second color filter transparent to a second light and contacting one lateral surface of the one of the pair of first color filters and one lateral surface of the other one of the pair of first color filters, and
a third color filter transparent to a third light and contacting another lateral surface of the one of the pair of first color filters and another lateral surface of the other one of the pair of first color filters,
wherein each of the plurality of color filters extends horizontally and covers a corresponding one of the first to fourth pixel regions, and
the second part of the pixel separation structure in each of the first to fourth pixel regions is parallel to one of a first direction and a second direction that intersects the first direction, the first direction being parallel to the first surface of the substrate.

17. The image sensor of claim 16, wherein a bottom surface of the first part of the pixel separation structure is coplanar with a second surface of the substrate, the second surface facing the first surface.

18. The image sensor of claim 16, wherein
the one of the pair of first color filters overlaps the first pixel group,
the second color filter overlaps the third pixel group spaced apart in the first direction from the first pixel group, and
the first to fourth pixel regions of the first pixel group and the first to fourth pixel regions of the second pixel group are aligned in the one of the first and second directions.

19. The image sensor of claim 16, wherein at least one of the color filters extends horizontally and covers the first to fourth pixel regions of the first pixel group.

20. The image sensor of claim 19, wherein each of the color filters has a width in the first direction, the width ranging from about 2 μm to about 3 μm.

* * * * *